(12) United States Patent
Ishizaka et al.

(10) Patent No.: US 8,999,841 B2
(45) Date of Patent: Apr. 7, 2015

(54) SEMICONDUCTOR DEVICE MANUFACTURING METHOD

(75) Inventors: Tadahiro Ishizaka, Nirasaki (JP); Atsushi Gomi, Nirasaki (JP); Kenzi Suzuki, Nirasaki (JP); Tatsuo Hatano, Nirasaki (JP); Yasushi Mizusawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/566,515

(22) Filed: Aug. 3, 2012

(65) Prior Publication Data
US 2013/0203250 A1 Aug. 8, 2013

(30) Foreign Application Priority Data

Aug. 5, 2011 (JP) ................ 2011-172265
Feb. 17, 2012 (JP) ................ 2012-033310

(51) Int. Cl.
| | | |
|---|---|---|
| *H01L 21/44* | (2006.01) | |
| *H01L 21/768* | (2006.01) | |
| *H01L 21/02* | (2006.01) | |
| *H01L 21/3105* | (2006.01) | |
| *H01L 21/67* | (2006.01) | |

(Continued)

(52) U.S. Cl.
CPC .... *H01L 21/76841* (2013.01); *H01L 21/02063* (2013.01); *H01L 21/02126* (2013.01); *H01L 21/3105* (2013.01); *H01L 21/67207* (2013.01); *C23C 14/02* (2013.01); *C23C 14/046* (2013.01); *C23C 16/02* (2013.01); *C23C 16/045* (2013.01); *H01L 21/28556* (2013.01); *H01L 21/76814* (2013.01); *H01L 21/76826* (2013.01); *H01L 21/76843* (2013.01)

(58) Field of Classification Search
CPC ........................................................ H01L 21/76
USPC ................ 257/301, 751, 774; 438/618
See application file for complete search history.

(56) References Cited

U.S. PATENT DOCUMENTS 5,622,896 A * 4/1997 Knotter et al. ................ 438/123
5,684,122 A * 11/1997 Inoue et al. .................. 528/363

(Continued)

FOREIGN PATENT DOCUMENTS

| JP | 2005-347472 | 12/2005 |
| JP | 2009-4541 A | 1/2009 |

(Continued)

OTHER PUBLICATIONS

Korean Office Action issued Jan. 23, 2014 in Patent Application No. 10-2012-0084458.

*Primary Examiner* — Ha Tran T Nguyen
*Assistant Examiner* — Ismail Muse
(74) *Attorney, Agent, or Firm* — Oblon, McClelland, Maier & Neustadt, L.L.P.

(57) ABSTRACT

A semiconductor device manufacturing method includes: modifying a surface of a burying recess, of which surface is hydrophobic and which is formed in a dielectric film, to a hydrophilic state by supplying a plasma containing H ions and H radicals or a plasma containing NHx (x being 1, 2 or 3) ions and NHx radicals to the dielectric film formed on a substrate and containing silicon, carbon, hydrogen and oxygen, a bottom portion of the burying recess being exposed with a lower conductive layer; and directly forming an adhesion film formed of a Ru film on the hydrophilic surface of the recess. The method further includes burying copper forming a conductive path in the recess.

3 Claims, 29 Drawing Sheets

(51) Int. Cl.

*C23C 14/02* (2006.01)
*C23C 14/04* (2006.01)
*C23C 16/02* (2006.01)
*C23C 16/04* (2006.01)
*H01L 21/285* (2006.01)

(56) References Cited

U.S. PATENT DOCUMENTS

| | | | | |
|---|---|---|---|---|
| 6,387,813 B1* | 5/2002 | Yang et al. | | 438/699 |
| 7,049,275 B2* | 5/2006 | Ikemoto et al. | | 510/176 |
| 2001/0013617 A1* | 8/2001 | Toyoda et al. | | 257/301 |
| 2002/0107160 A1* | 8/2002 | Zazzera et al. | | 510/175 |
| 2003/0155657 A1* | 8/2003 | Tonegawa et al. | | 257/774 |
| 2005/0272247 A1 | 12/2005 | Ikeda et al. | | |
| 2006/0060970 A1* | 3/2006 | Jeong et al. | | 257/750 |
| 2006/0079005 A1* | 4/2006 | Brask et al. | | 438/3 |
| 2006/0220248 A1* | 10/2006 | Suzuki | | 257/751 |
| 2007/0032676 A1* | 2/2007 | Todd | | 556/482 |
| 2008/0009143 A1* | 1/2008 | Yamada et al. | | 438/787 |
| 2008/0111242 A1* | 5/2008 | Lin et al. | | 257/758 |
| 2008/0207595 A9* | 8/2008 | Molino et al. | | 514/217.01 |
| 2008/0237860 A1* | 10/2008 | Ishizaka et al. | | 257/751 |
| 2008/0318408 A1* | 12/2008 | Yamada et al. | | 438/618 |
| 2009/0233120 A1* | 9/2009 | Maruyama et al. | | 428/612 |
| 2010/0081274 A1* | 4/2010 | Ishizaka et al. | | 438/653 |
| 2010/0324214 A1* | 12/2010 | Doerr et al. | | 524/840 |
| 2012/0319179 A1* | 12/2012 | Huang et al. | | 257/288 |

FOREIGN PATENT DOCUMENTS

| | | |
|---|---|---|
| KR | 10-0419272 B1 | 2/2004 |
| KR | 10-0516337 B1 | 9/2005 |
| KR | 10-2008-0028493 A | 3/2008 |
| KR | 10-2011-0081155 | 7/2011 |
| WO | 2010/037074 | 4/2010 |

* cited by examiner

PREPROCESSING + REDUCING OXIDE
+ HYDROPHILIC MODIFYING

FORMING Ru FILM

BURYING Cu

CMP

SURFACE PROCESSING

PURIFYING PROCESS

Ru FILM FORMATION

MONOGLYME

DIGLYME

COMPARATIVE EXAMPLE 2
100sec

COMPARATIVE EXAMPLE 2
200sec

COMPARATIVE EXAMPLE 2
300sec

TEST EXAMPLE 2
100sec.~1.5nm

TEST EXAMPLE 2
200sec.~2.5nm

TEST EXAMPLE 2
300sec.~3.5nm

COMPARATIVE EXAMPLE 3
100sec

COMPARATIVE EXAMPLE 3
200sec

COMPARATIVE EXAMPLE 3
300sec

TEST EXAMPLE 3
100sec

TEST EXAMPLE 3
200sec

TEST EXAMPLE 3
300sec

COMPARATIVE EXAMPLE 4

TEST EXAMPLE 4

(a) COMPARATIVE EXAMPLE 5 (O1s)

(b) TEST EXAMPLE 5 (O1s)

(a) COMPARATIVE EXAMPLE 5 (Si2p)

(b) TEST EXAMPLE 5 (Si2p)

(a) COMPARATIVE EXAMPLE 6 (C1s)

(b) TEST EXAMPLE 6 (C1s)

(a) COMPARATIVE EXAMPLE 7 (N1s)

(b) TEST EXAMPLE 7 (N1s)

US 8,999,841 B2

SEMICONDUCTOR DEVICE MANUFACTURING METHOD

CROSS-REFERENCE TO RELATED APPLICATION

This application claims priority to Japanese Patent Application No. 2011-172265 filed on Aug. 5, 2011 and Japanese Patent Application No. 2012-033310 filed on Feb. 17, 2012, the entire contents of which are incorporated herein by reference.

FIELD OF THE INVENTION

The present invention relates to a technique for forming a wiring by burying copper in a burying recess formed in a dielectric film as a low-k film in a semiconductor device manufacturing method.

BACKGROUND OF THE INVENTION

In a processing for forming a multilayer interconnection structure included in a semiconductor device manufacturing process, a low-k film, e.g., a SiCOH film containing silicon (Si), carbon (C), hydrogen (H) and oxygen (O), is formed as an interlayer dielectric film and, then, a recess such as a trench or a via hole is formed in the interlayer dielectric film. Next, an upper wiring connected to a lower wiring is formed by burying copper in the recess. In order to prevent the copper from being diffused in the interlayer dielectric film, Ta (tantalum), TaN (tantalum nitride), or a laminated film thereof, for example, is formed as a so-called barrier film between the copper wiring and the interlayer dielectric film. In addition, Ti (titanium), TiN (titan nitride), or a laminated film thereof is known as the barrier film.

As a line width of a copper wiring is miniaturized along with miniaturization of a pattern of a semiconductor device, a wiring resistance or an electrode resistance (via resistance) in a via hole is increased, and this affects performance of the semiconductor device. In order to decrease a resistance of a conductive path (wiring and electrode), it is required to increase volume of Cu and decrease a via resistance by reducing a film thickness of an adhesion film or a barrier film formed at a bottom portion of the via hole and decreasing the number of interfaces.

Meanwhile, the above-described material used for the barrier film has a high resistance and is disadvantageous in that burial characteristics thereof become poor when the line width of the burying recess is miniaturized and the aspect ratio is increased.

In view of the above, it is suggested to use a barrier film made of Ru (ruthenium) having a low resistance and good burial characteristics, instead of the above-described material (U.S. Patent Application Publication No. US2008/237860A1 (FIG. 1)). FIGS. 25A to 25E show processes of forming a copper wiring in the case of using Ru as a barrier film.

First, a burying recess 2 such as a trench or a via hole is formed in an upper interlayer dielectric film (SiCOH film) 1 in FIG. 25A. Next, a base film 3 such as Ta, TaN or the like 3 is formed in the recess 2 in FIG. 25B. Then, a Ru film 4 is formed on the base film 3 in FIG. 25C. Thereafter, a copper material (buried material made of copper) 5 is buried in the recess 2 in FIG. 25D and, then, a residual copper material 5 is removed by CMP (Chemical Mechanical Polishing). As a result, an upper wiring structure is formed in FIG. 25E. Reference numerals '61 to 63' indicate a lower interlayer dielectric film, a copper wiring and a barrier layer, respectively. A reference numeral '64' indicates an etching stopper film (film serving as a stopper during etching) having a function of preventing diffusion of copper.

The reason that the base film 3 is interposed between the interlayer dielectric film 1 and the Ru film 4 is described as follows.

The bonds in the SiCOH film as the interlayer dielectric film 1 are terminated by a plasma during etching or ashing, so that C is separated from the film. Dangling bonds generated by separation of C are bonded to moisture in the atmosphere or the like and turned into Si—OH. Thus, a surface layer may become a damage layer. The damage layer has a slightly increased relative dielectric constant because a concentration of C therein is decreased. If necessary, it is preferable to remove the damage layer. Further, the surface layer of the substrate may be removed by, e.g., hydrofluoric acid, in order to remove the damage layer or remove residues generated by etching or ashing from the surface of the substrate. Hence, the surface state of the interlayer dielectric film 1 just before the burial of the barrier film is highly hydrophobic.

Meanwhile, Ru has a high Gibbs' free energy of oxide formation and thus is not easily bonded to O of the SiCOH film. Therefore, a base film 3 made of Ta having a low Gibbs' free energy of oxide formation or the like is thinly formed. In that case, the Ru film 4 is used as the barrier film, so that the effect of poor burial characteristics or high resistance of the base film 3 is decreased. However, since the base film 3 is interposed, in addition to the Ru film 4, between the lower copper and the upper copper at the bottom portion of the via hole, further improvement is required in order to reduce the resistance of the conductive path.

Japanese Patent Application Publication No. 2005-347472 (JP2005-347472A) (FIGS. 1 and 3) describes a technique in which a SiCOH film is processed with a hydrogen plasma to remove a methyl group or the like from the surface of a recess and terminate bonds with H. Thus, the problem, in which the film quality is deteriorated when the barrier film is formed in a state where a part of the SiCOH film subjected to plasma etching is coupled to the burying recess and thus nucleation occurs around the methyl group or the like, may be solved. This technique is different from that of the present invention in that the surface of the recess to be processed is hydrophilic.

SUMMARY OF THE INVENTION

In view of the above, the present invention provides a technique capable of reducing a resistance of a conductive path formed by burying copper in a recess formed in a dielectric film, e.g., a SiCOH film.

In accordance with an aspect of the present invention, there is provided a semiconductor device manufacturing method including: modifying a surface of a burying recess, of which surface is hydrophobic and which is formed in a dielectric film, to a hydrophilic state by supplying a plasma containing H ions and H radicals or a plasma containing NHx (x being 1, 2 or 3) ions and NHx radicals to the dielectric film formed on a substrate and containing silicon, carbon, hydrogen and oxygen, a bottom portion of the burying recess being exposed with a lower conductive layer; directly forming an adhesion film formed of a Ru film on the hydrophillc surface of the recess; and burying copper forming a conductive path in the recess.

In accordance another aspect of the present invention, there is provided a semiconductor device manufacturing method including: modifying a surface of a burying recess formed in a dielectric film by supplying hydrogen peroxide to the dielectric film formed on a substrate and containing silicon, carbon, hydrogen and oxygen, a bottom portion of the burying recess being exposed with a lower conductive layer; directly forming an adhesion film formed of a Ru film on the modified surface of the recess; and burying copper forming a conductive path in the recess.

In accordance still another aspect of the present invention, there is provided a semiconductor device manufacturing method including: modifying a surface of a burying recess formed in a dielectric film by supplying glyme in a liquid or a gaseous state to the dielectric film formed on a substrate and containing silicon, carbon, hydrogen and oxygen, a bottom portion of the burying recess being exposed with a lower conductive layer; directly forming an adhesion film formed of a Ru film on the modified surface of the recess; and burying copper forming a conductive path in the recess.

In accordance with the aspect described above, Dimethyl-ethylenediamine (DMEDA) may be used instead of glyme.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

[First Embodiment]

Figure 1A:
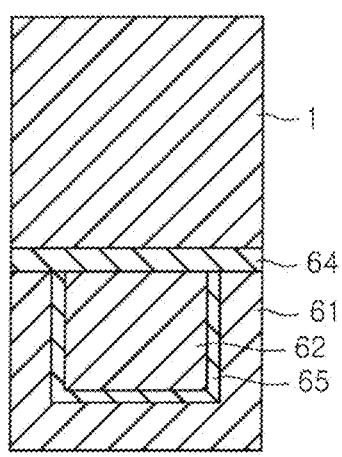
FIGS. 1A to 1C explain steps performed in an initial stage a modification process performed in a first embodiment of the present invention.

An embodiment of a semiconductor device manufacturing method in accordance with the present invention will be described with reference to drawings. FIGS. 1A to 1C and FIGS. 2A to 2D show states of forming an upper wiring structure on a lower wiring structure in a semiconductor device manufacturing process. In FIGS. 1A to 1C and FIGS. 2A to 2D, like reference numerals refer to like parts in FIGS. 25A to 25E. A reference numeral '65' indicates a barrier film, e.g., a Ru film.

Figure 1B:
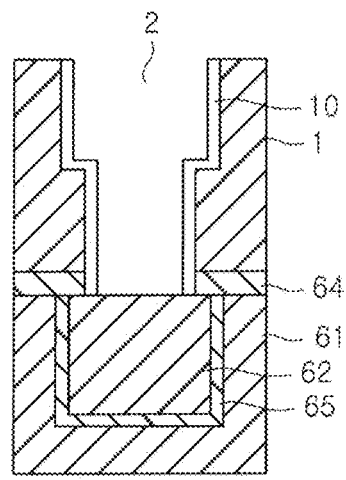

First, an interlayer dielectric film 1, e.g., a SiCOH film, is formed on a substrate, e.g., a semiconductor wafer, having a lower wiring structure formed thereon (FIG. 1A). The film formation is performed by a plasma CVD (Chemical Vapor Deposition) method, and DEMS (DiEthoxyMethylSilane) is used as a processing gas, for example. Next, a recess 2 such as a trench serving as a wiring groove or a via hole for forming an electrode as a connection portion of a lower wiring is formed on the interlayer dielectric film 1 (FIG. 1B). The process for forming the recess 2 can be performed by forming a resist pattern and performing multiple steps of plasma etching while using, e.g., a sacrificial film. A line width of the trench is, e.g., in a range from 20 to 50 nm, and a diameter of the via hole is, e.g., in a range from 20 to 50 nm.

Then, the substrate is cleaned by cleaning liquid to remove residues adhered to the surface of the substrate during ashing and etching for forming the recess 2.

Figure 1C:
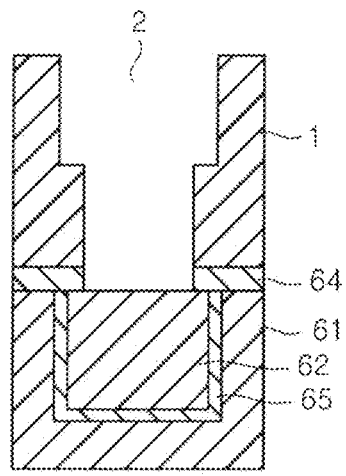

When the recess 2 is formed, the surface layer of the interlayer dielectric film (SiCOH film) 1 is damaged (bonds are broken) by the plasma as described above. Thus, C is separated from the film, and Si—OH bonds are generated by moisture in the atmosphere or the like. A reference numeral '10' in FIG. 1B indicates the damage layer described in the background of the invention. In this example, the damage layer 10 is removed by wet etching using, e.g., hydrofluoric acid (FIG. 1C).

Figure 2A:
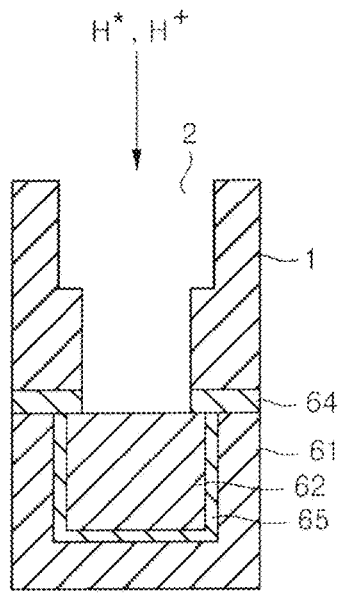
FIGS. 2A to 2D explain a series of copper wiring forming processes performed in the first embodiment in a stepwise manner.

The substrate that has been subjected to the above processes undergoes a series of processes for burying copper which includes a modification process, as shown in FIGS. 2A to 2D. First, a processing module for performing the modification process will be described with reference to FIG. 3. In FIG. 3, a reference numeral '71' indicates a processing chamber as a vacuum chamber. A stage 72 provided with a heater as a heating unit is provided in the processing chamber 71, and a gas exhaust line 73 is connected to a bottom portion of the processing chamber 71. A vacuum exhaust unit 74 is provided at a downstream side of the gas exhaust line 73.

A vertically extending plasma generation line 75 is connected to a center of a ceiling portion of the processing chamber 71, and a gas supply line 76 is connected to a top portion of the plasma generation line 75. A periphery of the plasma generation line 75 is wounded by an induction coil 77 for generating an induced electric field for converting a gas supplied from the gas supply line 76, i.e., a hydrogen gas in this example, into a plasma. A high frequency power supply 78 is connected to both ends of the induction coil 77.

When a high frequency power of, e.g., about 1.5 kw, is supplied from the high frequency power supply 78 to the induction coil 77 while supplying the hydrogen gas from the gas supply line 76 to the plasma generation line 75, the hydrogen gas is turned into a plasma, thereby generating an inductively coupled plasma, as schematically indicated by a notation 'P' in FIG. 3. Active species containing H radicals (hydrogen radicals) and H ions such as H+, H−, and the like generated by the plasma are transferred to the processing chamber 1 and supplied to a substrate S on the stage 72. In other words, this processing module performs a modification process, e.g., a plasma process, on a substrate by using a remote plasma.

Figure 4:
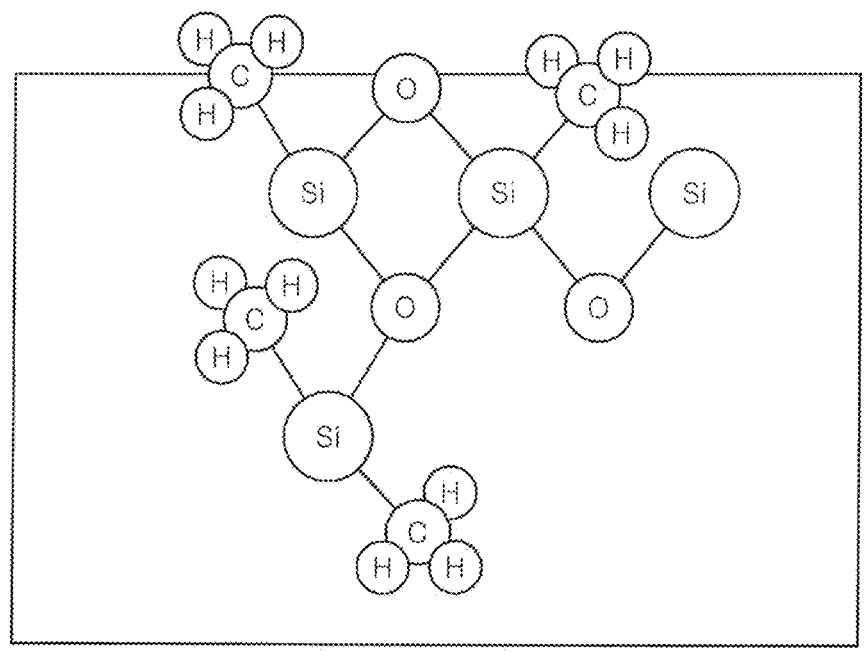
FIG. 4 schematically explains a molecular structure on a surface of a dielectric film before the modification process performed in the first embodiment.
Figure 5A:
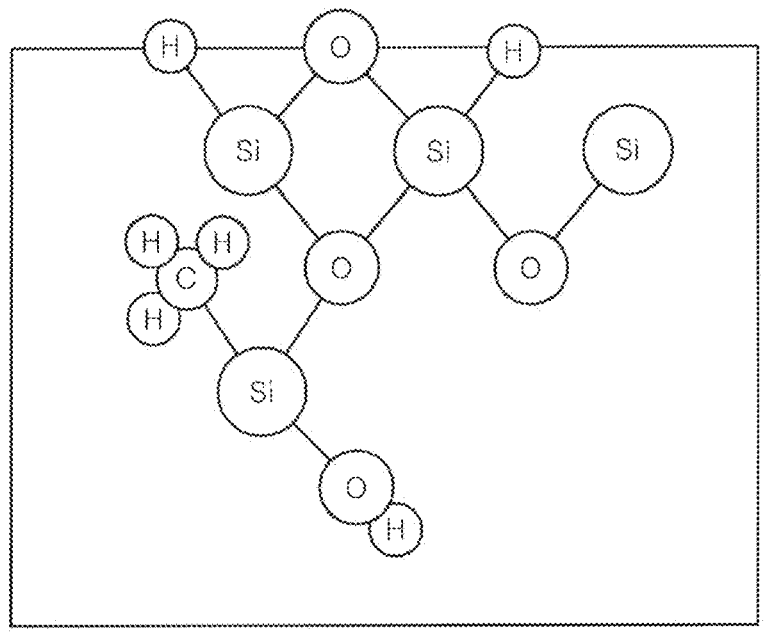
FIGS. 5A and 5B schematically explain a molecular structure on a surface of the dielectric film after the modification process.
Figure 5B:
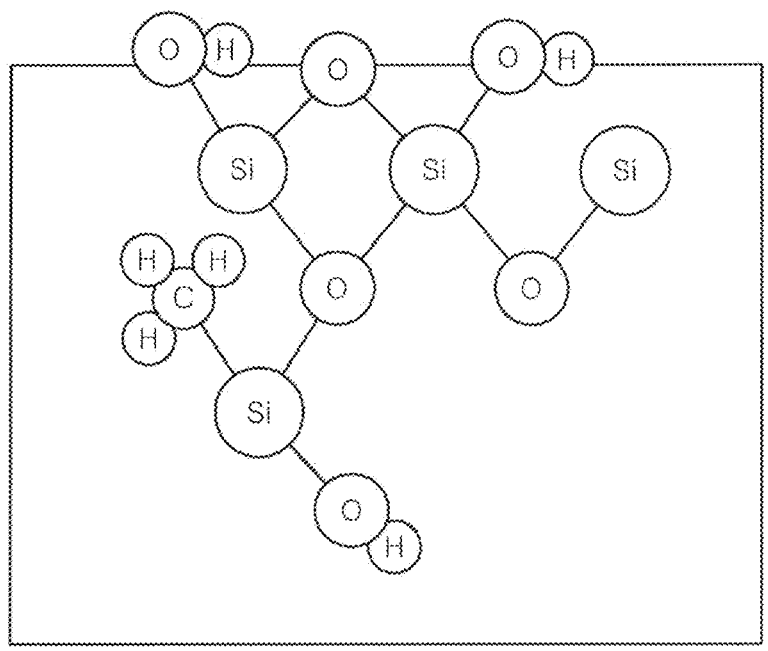

Since the damage layer 10 is removed from the surface of the interlayer dielectric film 1 (including the inner surface of the recess 2) on the substrate S as described above, the surface of the interlayer dielectric film 1 has methyl groups thereon as shown in FIG. 4 which has a hydrophobic property. When H radicals and H ions are supplied onto the surface, Si—$CH_3$ bonds are broken and H atoms are bonded to dangling bonds, thereby forming Si—H bonds as shown in FIG. 5A. If the atmosphere where the substrate S is positioned contains moisture, the surface of the interlayer dielectric film 1 is oxidized by the moisture and Si—H bonds are converted to Si—OH bonds as shown in FIG. 5B. The surfaces shown in FIGS. 5A and 5B are hydrophilic. That is, the surface of the interlayer dielectric film 1 has been modified from a hydrophobic state to a hydrophilic state by H radicals and H ions. FIG. 2A shows steps of the modification process.

In the processing module, the substrate S is heated to, e.g., about 250° C., by a heater (not shown) provided at the stage 72. Accordingly, organic materials adhered to the substrate S in the atmosphere or impurities such as residues that are not removed in the above cleaning process and the like are removed by gasification. When the substrate S is exposed to the atmosphere, the surface of the lower copper wiring 62 exposed to the bottom portion of the recess 2 of the interlayer dielectric film 1 is oxidized by moisture or oxygen. However, the oxide on the surface of the copper wiring 62 is reduced by H radicals.

Conventionally, the oxide on the surface of the copper wiring 62 is reduced by H radicals. In that case, H ions in the plasma are removed to prevent the surface of the interlayer dielectric film 1 from being damaged (removal of methyl groups). In order to process the substrate with only H radicals, it is required to provide a conductive mesh body between the plasma generation space and the substrate. Accordingly, H ions are removed by the mesh body, and only H radicals can be supplied to the substrate.

The present inventors have found that when H ions exist, the surface of the interlayer dielectric film 1 is modified to a hydrophilic state, whereas the removal of the methyl groups occurs only on the surface and does not occur inside the film by controlling processing time, a gas flow rate and the like. Therefore, the processing time is set to, e.g., about 15 seconds to 30 seconds, and the flow rate of the hydrogen gas is set to, e.g., about 5 sccm to 100 sccm. Further, the processing pressure is set to, e.g., about 30 Pa to 90 Pa. When the substrate S is processed under such processing conditions, the surface of the interlayer dielectric film 1 can be modified and, also, the oxide on the surface of the lower copper wiring 62 can be reduced.

A conductive mesh body, e.g., a metal mesh body, is provided at an outlet side of the plasma generation line 75 shown in FIG. 3 so as to be movable between a position for blocking the outlet and a position for opening the outlet. Thus, a process for reducing the oxide on the surface of the lower copper wiring 62 by supplying only H radials to the substrate while blocking the outlet by the mesh body and a process for modifying the surface of the interlayer dielectric film 1 by H radicals and H ions while opening the outlet by retreating the mesh body may be separately performed. Both processes are performed under optimal processing conditions.

Figure 2B:
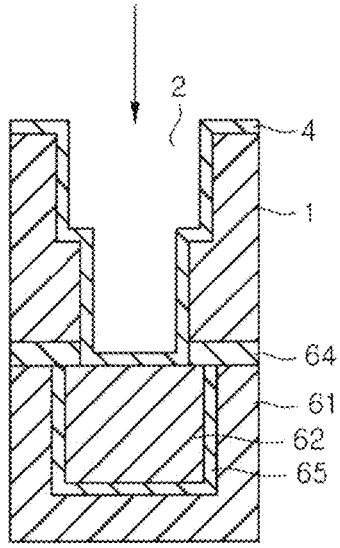
Figure 3:
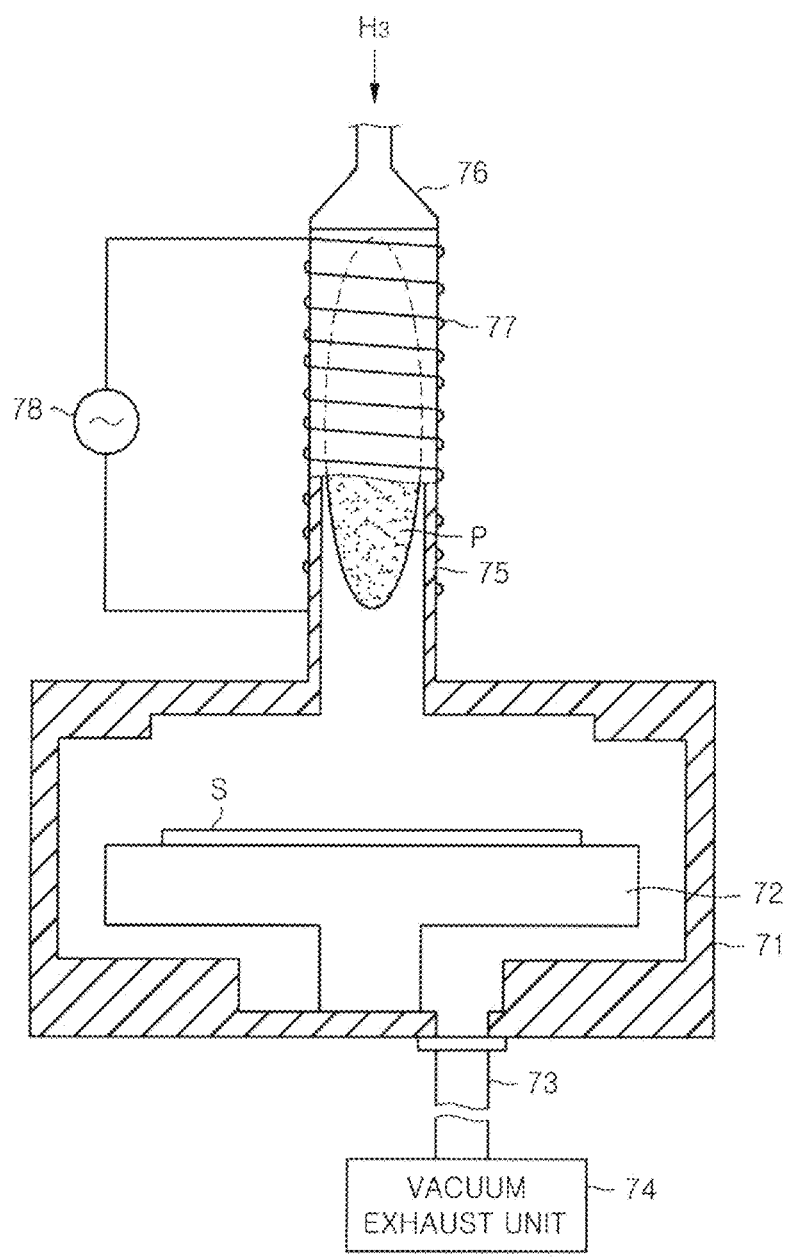
FIG. 3 is a vertical cross sectional view showing an example of an apparatus for performing the modification process.

Upon completion of the modification of the surface of the interlayer dielectric film 1, a Ru film 4 is formed on the surface of the substrate, i.e., on the surface of the interlayer dielectric film 1 and the top surface of the lower copper wiring 62 exposed to the bottom portion of the via hole (FIG. 2B).

Figure 6:
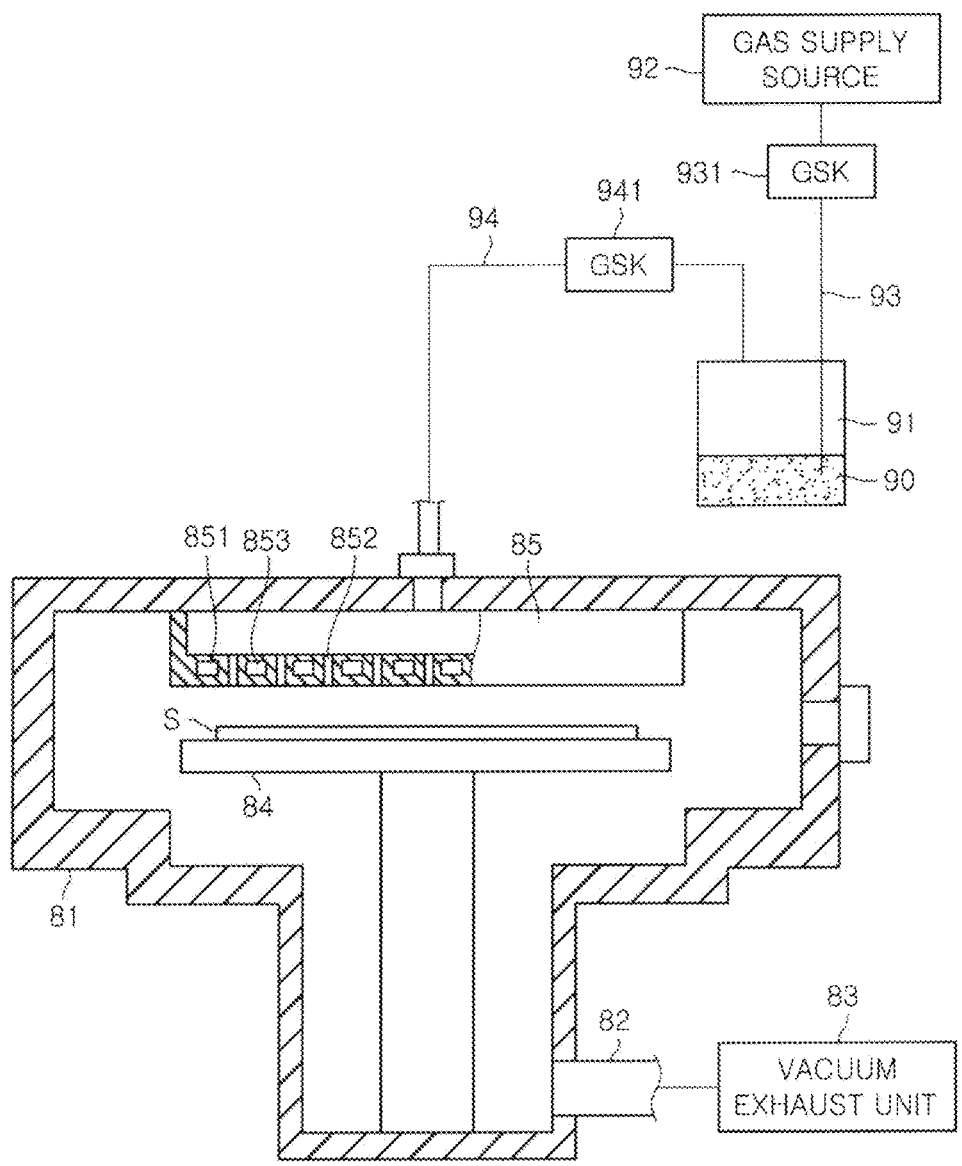
FIG. 6 is a vertical cross sectional view showing an example of a module (apparatus) for forming a Ru film.

FIG. 6 shows a processing module forming a thermal CVD apparatus for forming a Ru film. Reference numerals '81' to '85' indicate a processing chamber, e.g., a mushroom-shaped vacuum chamber, a gas exhaust line, a vacuum exhaust unit, a stage having therein a heater (not shown), and a gas shower head for supplying a processing gas to the substrate S on the stage 84, respectively. The gas shower head 85 includes a shower plate 851 having a plurality of gas injection holes 852 for uniformly supplying a gas to a processing atmosphere. Further, a temperature control fluid path 853 forming a temperature control unit is formed in the shower plate 851.

An external processing gas supply line 94 is connected to the gas shower head 84, and a raw material container 91 is connected to a base side of the processing gas supply line 94. The raw material container 91 accommodates therein a precursor of Ru, e.g., a powder 90 formed of $Ru_3(CO)_{12}$. For example, one end of a carrier gas supply line 93 is introduced into the powder 90, and the other end of the carrier gas supply line 93 is connected to a CO gas supply source 92. Accordingly, when a carrier gas, e.g., CO gas, is supplied into the raw material container 91, $Ru_3(CO)_{12}$ is sublimated and the gas thus generated is supplied to the gas shower head 85. Reference numerals '931' and '941' indicate gas supply kits (GSK) such as a valve, a flow rate controller and the like.

In the processing module, the substrate S is loaded onto the stage 84 by an elevation pin (not shown) from an outside and is heated to, e.g., about 150° C. to 300° C., the $Ru_3(CO)_{12}$ gas is supplied from the raw material container 91 into the processing chamber 81 via the gas supply line 94 and the gas shower head 85 while using CO gas as a carrier. As a consequence, a CVD reaction occurs on the substrate S, and the Ru film 4 is formed. The film thickness of the Ru film 4 is set to, e.g., about 2 nm.

The surface of the interlayer dielectric film 1 is modified to have a hydrophilic property as described above, so that the surface energy thereof is high. Thus, the raw material gas is easily adsorbed thereon. Accordingly, as will be proved in test examples to be described later, a nucleation speed of Ru in the initial stage of the film formation is improved, and a continuous film can be formed. Accordingly, the Ru film 4 can be directly formed on the surface of the interlayer dielectric film 1. When the Ru film 4 is formed by using $Ru_3(CO)_{12}$ gas and CO gas, the film formation can be performed while suppressing reaction.

Therefore, the film thickness can be controlled with high precision. As for the raw material of the Ru film, a Ru organic compound described in JP2005-347472A can be used other than the above-described raw material.

The Ru film can be formed by a so-called ALD method other than the CVD method. In the ALD method, a gas as a precursor of Ru and a reactive gas that reacts with the precursor are alternately supplied to the substrate, and vacuum exhaust is carried out when the gas is switched. As a result, a laminated film is obtained by laminating an atomic layer or a molecular layer one by one.

Figure 2C:
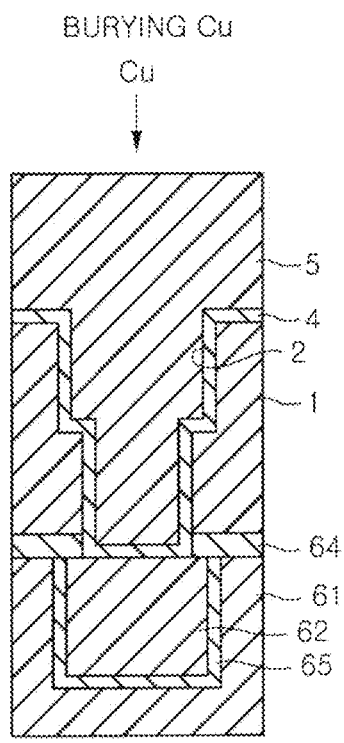

Next, a copper material 5 is buried in the recess 2 by sputtering copper on the substrate W (FIG. 2C). The copper material 5 may be buried by forming a copper seed layer in the recess 2 by sputtering and then burying copper by a plating method. After the copper material 5 is buried in the recess 2, annealing is performed by heating the substrate S to about 150° C. in the vacuum atmosphere to stabilize the grain size of the copper material 5. In the following description, in order to simplify the description, a reference numeral '5' is used to refer to a copper material, a copper wiring and a copper electrode.

Figure 2D:
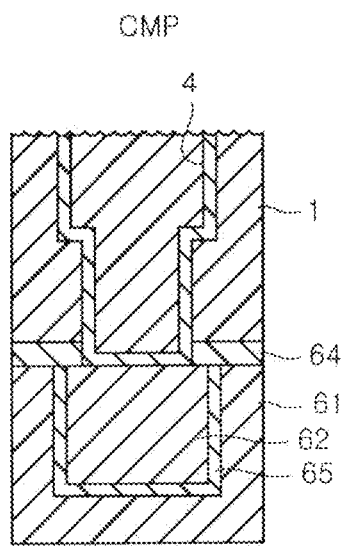

After the copper is buried, the residual copper is removed by polishing the surface of the substrate S by CMP. As a result, the upper copper wiring structure is obtained (FIG. 2D).

Figure 7:
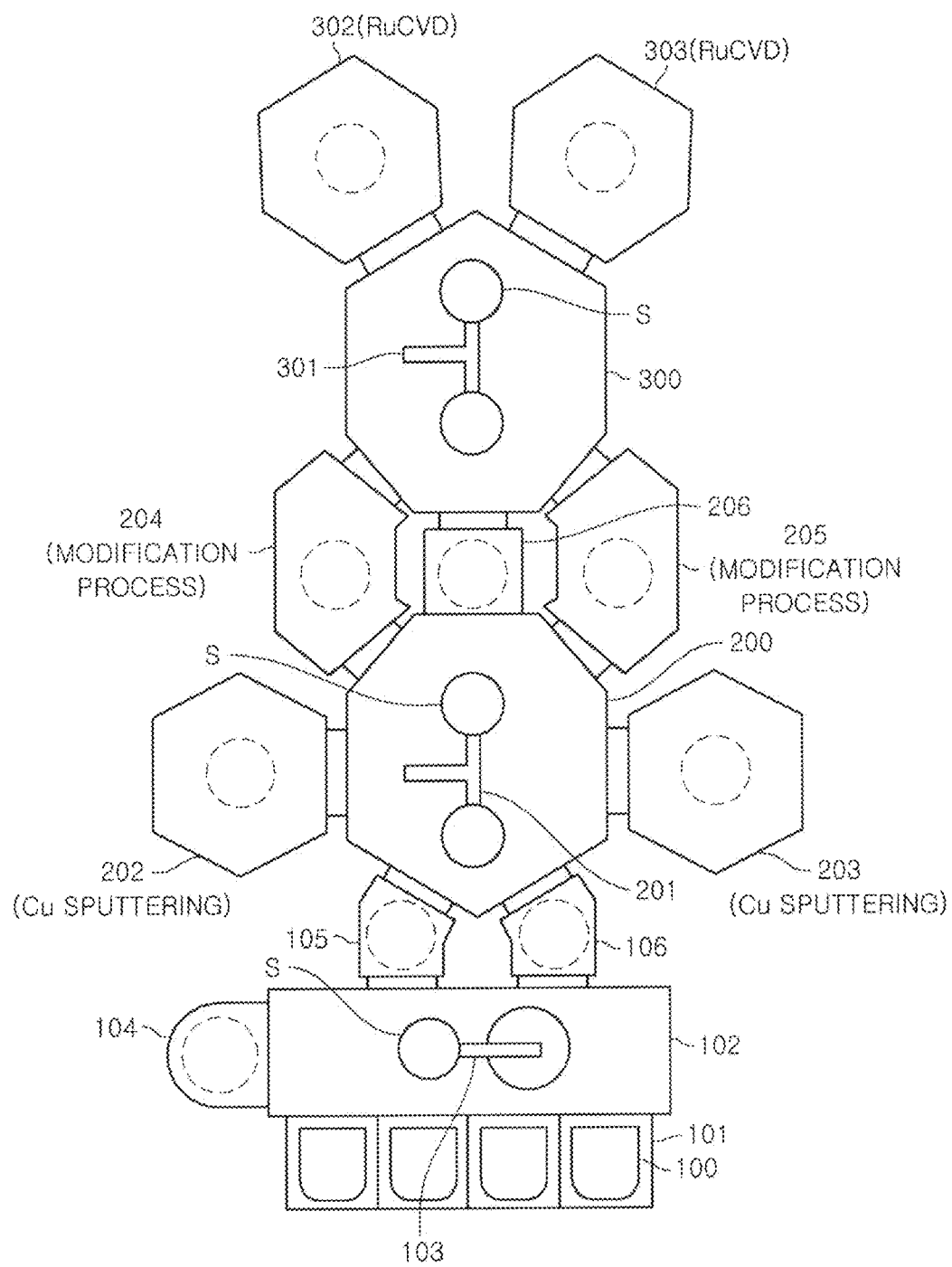
FIG. 7 is a schematic plan view showing a substrate processing apparatus as a multi chamber system for performing a series of processes performed in the first embodiment.

FIG. 7 shows a substrate processing system for performing the steps shown in FIGS. 2A to 2C. Reference numerals '101' to '104' indicate a loading/unloading port for loading and unloading a transfer container 100, an atmospheric transfer chamber, an atmospheric transfer arm, and an alignment module for positioning a central position and a direction of the substrate (semiconductor wafer) S. When the transfer container 100 is a FOUP, a FOUP cover opening/closing unit or the like is provided between the loading/unloading port 101 and the atmospheric transfer chamber 102. A processing station is airtightly connected to the inner side of the atmospheric transfer chamber 102 via load-lock chambers 105 and 106. The substrate S accommodated in the transfer container 100 which has been loaded by the loading/unloading port 101 has a state in which the damage layer 10 is removed from the interlayer dielectric film 1 (state shown in FIG. 1C).

The processing station includes: a first vacuum transfer chamber 200 to which processing modules 202 to 205 are connected therearound and which has a first substrate transfer arm 201; and a second vacuum transfer chamber 300 to which processing modules 302, 303, 204 and 205 are connected therearound and which has a second substrate transfer arm. The processing modules 204 and 205 are modification processing modules for performing the modification process as shown in FIG. 3. The inlets and the outlets thereof are connected to the first and the second vacuum transfer chamber 200 and 300, respectively. Reference numerals '302' and '303' indicate thermal CVD modules for forming the Ru film 4 as shown in FIG. 6. Reference numerals '202' and '203' indicate sputtering modules for burying copper.

In the substrate processing system, the substrate S unloaded from the transfer container 100 is aligned in the alignment module 104. Next, the substrate S is loaded into the modification processing module 204 (or 205) via the load-lock chamber 105 (or 106) and the first substrate transfer chamber 200, and then is subjected to the above-described modification process using H radicals and H ions.

Thereafter, the substrate S is loaded into the CVD module 302 (or 303) via the second vacuum transfer chamber 300 and then subjected to the film formation of the Ru film 4.

Next, the substrate S is loaded into the sputtering module 202 (or 203) via the second vacuum transfer chamber 300, the load-lock chamber 206 and the first vacuum transfer chamber 200. Then, the copper material 5 is buried in the recess 2 on the substrate S by sputtering of copper. Thereafter, the substrate S is returned to the transfer container 100 via the first vacuum transfer chamber 200, the load-lock chamber 105 (or 106) and the atmospheric transfer chamber 102.

In accordance with the above-described embodiment, the hydrophobic surface of the SiCOH film (the interlayer dielectric film 1) is modified to a hydrophilic surface by H radicals and H ions, so that the surface energy thereof is increased. Therefore, the Ru film 4 can be directly formed on the surface of the interlayer dielectric film 1 by CVD as described above in detail. Accordingly, a base film formed of Ta described in JP2005-347472A becomes unnecessary. Since the base film of the Ru film 4 is not interposed between the lower copper wiring 62 at the bottom portion of the via hole and the copper electrode 5 in the via hole, a contact resistance therebetween is reduced. In addition, since the base film is not formed in the trench, a volume of copper can be increased, and a resistance of a conductive path including a wiring and a via can be suppressed.

When ozone is supplied to the surface of the interlayer dielectric film 1 by irradiation of ultraviolet rays, the surface can be modified to have a hydrophilic property. In that case, however, the surface of the copper wiring 62 exposed to the bottom portion of the recess 2 is oxidized.

Here, the active species for modifying the surface of the interlayer dielectric film 1 to a hydrophilic surface is not limited to a plasma of hydrogen gas, and may also be active species obtained by converting an ammonia ($NH_3$) gas into a plasma or active species obtained by converting a gaseous mixture of a nitrogen ($N_2$) gas and a hydrogen gas into a plasma. In that case as well, the apparatus shown in FIG. 3 can be used, and the above-described gas can be supplied instead of the hydrogen gas.

Figure 8:
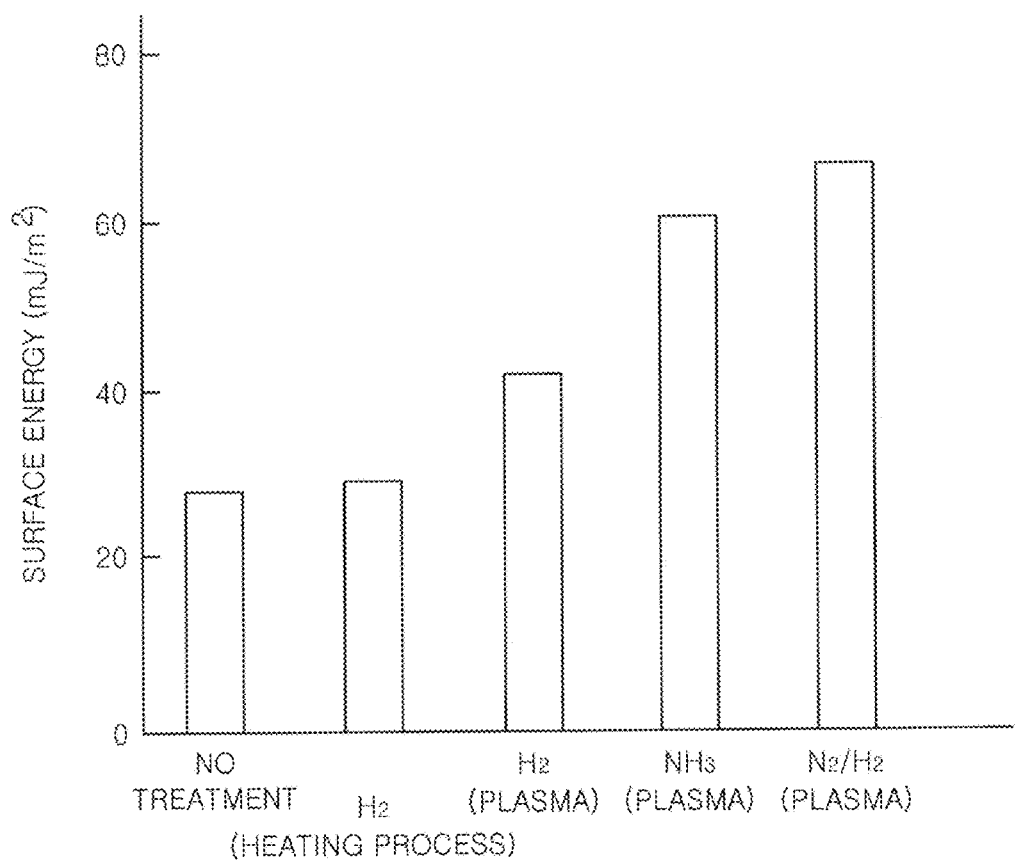
FIG. 8 explains relationship between surface treatment of a SiCOH film and a surface energy.

FIG. 8 shows a result of measuring the surface energy of the SiCOH film. A horizontal axis represents types of treatment performed on the SiCOH film. When no treatment is performed on the SiCOH film or when hydrogen gas is supplied by heating the SiCOH film, the surface energy is small. However, when the active species (H radicals and H ions) obtained by converting the hydrogen gas into a plasma are supplied to the SiCOH film, the surface energy is increased. Moreover, when an ammonia gas is turned into a plasma or when a gaseous mixture of a nitrogen gas and a hydrogen gas is turned into a plasma, the surface energy is further increased and the surface of the SiCOH film can be modified to have a hydrophilic property.

In accordance with the embodiment of the present invention, the surface of the recess is modified to have a hydrophilic property by supplying a plasma containing H ions and H radicals to a dielectric film, e.g., a SiCOH film having a hydrophobic surface and a burying recess formed therein. Since the surface of the recess is hydrophilic, the surface energy is increased and a Ru film can be directly formed on the surface of the recess without using a base film. Hence, a resistance of a conductive path formed by burying copper in the recess can be reduced, and the present invention is preferably used as a method for manufacturing a semiconductor device in which a line width of a pattern is miniaturized.

[Second Embodiment]

In the present embodiment, when the hydrophobic surface (the surface obtained after removing the damage layer 10 by hydrofluoric acid) of the interlayer dielectric film 1 in the first embodiment is modified to a hydrophilic surface, hydrogen peroxide is supplied to the surface of the interlayer dielectric film 1 instead of performing plasma processing. In that case, methyl groups in the surface of the interlayer dielectric film 1 are substituted by OH groups, so that the same effect as that of the first embodiment is obtained.

Figure 9:
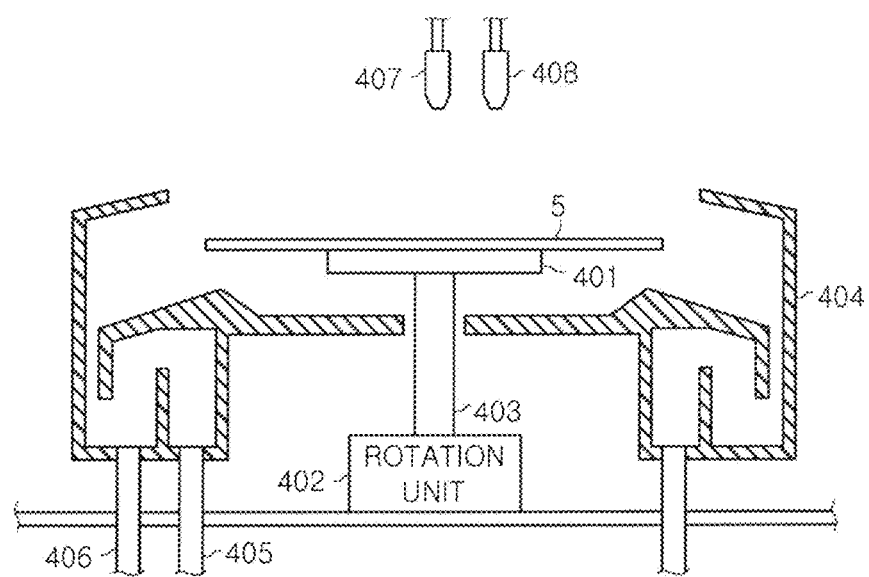
FIG. 9 is a vertical cross sectional view showing an example of an apparatus for performing a modification process performed in a second or a third embodiment of the present invention.

FIG. 9 shows an example of a module for performing surface treatment using hydrogen peroxide. In FIG. 9, reference numerals '401', '404', '405' and '406' indicate a spin chuck rotated about a rotational shaft 403 by a rotation unit 402, a cup body for preventing scattering of liquid, a gas exhaust line, and a liquid exhaust line. The substrate S is mounted on the spin chuck 401 and rotated. In that state, hydrogen peroxide is supplied from a nozzle 407 to the central portion of the substrate S for, e.g., about 300 seconds. Then, pure water is supplied from a nozzle 408 instead of the nozzle 407 to the central portion of the substrate S to clean the surface thereof.

[Third Embodiment]

In the present embodiment, the damage layer 10 is removed from the surface layer of the interlayer dielectric film 1 having the recess 2 formed thereon by hydrogen peroxide instead of using hydrofluoric acid (FIG. 1C) in the first embodiment. In this treatment, e.g., the module shown in FIG. 9 can be used, and the hydrogen peroxide is supplied for, e.g., about 300 seconds.

In that case, the removal of the damage layer 10 and the modification process can be performed simultaneously. Thereafter, the Ru film 4 can be directly formed on the recess 2 of the interlayer dielectric film 1. Since, however, a period of time required for the surface treatment is increased, it is preferable to use the method for removing the damage layer 10 by hydrofluoric acid.

[Fourth Embodiment]

Figure 10A:
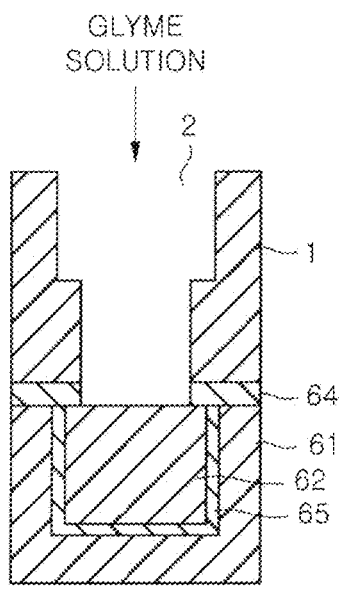
FIGS. 10A to 10C explain a series of copper wiring forming processes performed in a fourth embodiment in a stepwise manner.
Figure 10B:
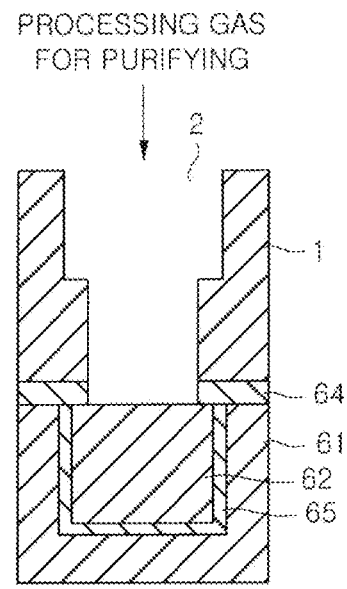
Figure 10C:
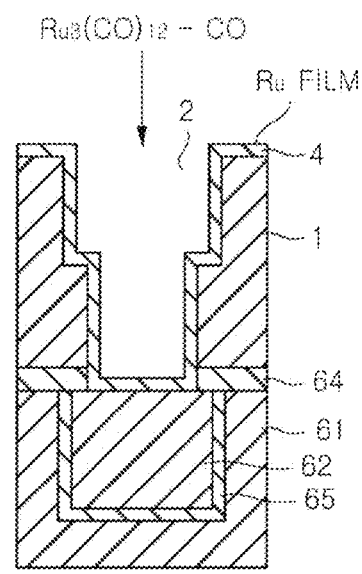
Figure 11A:
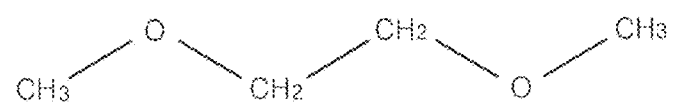
FIGS. 11A and 11B explain a molecular structural formula of a chemical used in the fourth embodiment.

In the fourth embodiment, glyme, e.g., monoglyme (dimethoxyethane), is used as a chemical for modifying the surface of the interlayer dielectric film 1. FIGS. 10A to 10C show a series of processes including a modification process in the fourth embodiment. After the recess is formed in the interlayer dielectric film 1 by performing plasma etching on the substrate, the surface of the substrate is cleaned by, e.g., hydrofluoric acid. Then, monoglyme solution is supplied to the cleaned surface of the substrate as shown in FIG. 10A. A molecular structural formula of monoglyme is shown in FIG. 11A.

As for a method for supplying monoglyme solution, a spin coating method using the apparatus shown in FIG. 9 can be employed. In this method, monoglyme solution is supplied to a central portion of a substrate and spread while rotating the substrate. It is also possible to employ a method for immersing into a chemical tank a plurality of substrates arranged in parallel and supported by a holding unit. The process recipe may include an example in which monoglyme solution of about 100% is supplied to the substrate for about 60 seconds.

Thereafter, the substrate is cleaned by, e.g., pure water, and the Ru film is formed on the surface of the substrate as described in the first embodiment. The Ru film is formed in, e.g., the vacuum atmosphere, by the processing module shown in FIG. 3. However, a purifying process as a pretreatment for purifying the substrate is performed before the Ru film formation. This process serves as a process for removing residues generated by ashing or plasma etching performed to form the recess 2 and removing an oxide generated on the surface of the copper wiring 62 exposed to the bottom portion of the recess 2 (preferably, the bottom portion of the via hole) when the substrate is cleaned by pure water and transferred under the atmospheric state. Further, the purifying process has a function of removing moisture adhered to the surface of the substrate.

The purifying process is carried out by converting hydrogen gas for the purifying process into a plasma while heating the substrate mounted on the mounting table in the vacuum atmosphere and then supplying a gas in which H ions in the plasma are removed (gas containing H radicals) to the substrate. Instead of H radicals, hydrogen gas may be supplied to the substrate without being converted into the plasma. FIG. 10B shows this step. The processes performed after the formation of the Ru film 4 shown in FIG. 10C are the same as those of the first embodiment.

Figure 12A:
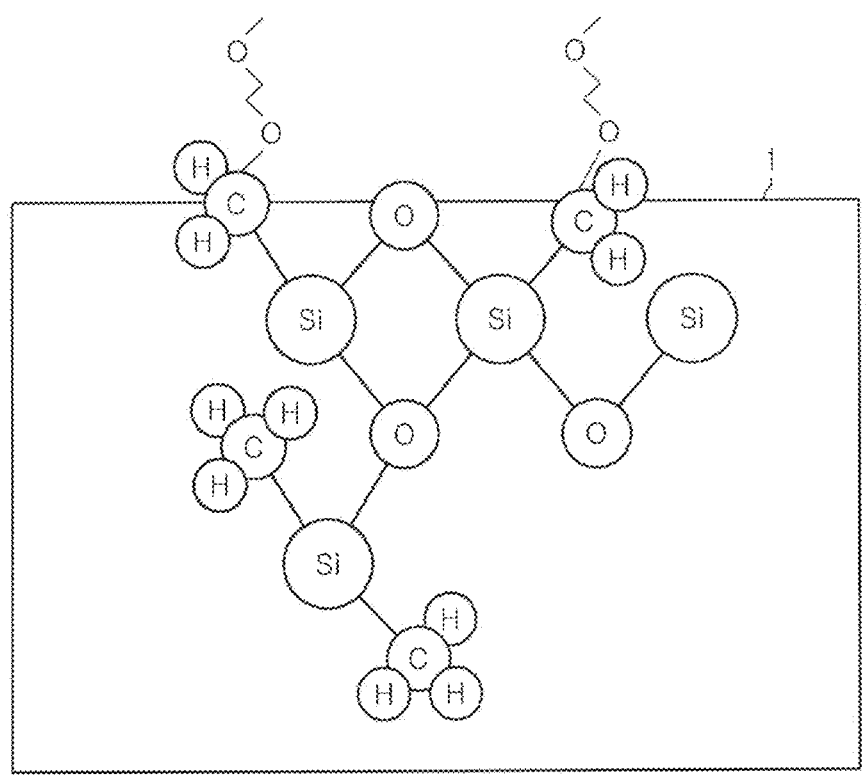
FIGS. 12A and 12B explain a molecular structure on a surface of a dielectric film after the modification process performed in the fourth embodiment.

FIG. 12A schematically shows a state in which surface treatment (modification process) is performed by supplying monoglyme solution to the surface of the substrate. In this drawing, the state in which hydrogen of the SiCOH film is substituted by methyl groups of monoglyme is illustrated. However, if monoglyme has polarity, the monoglime may be adsorbed to oxygen of the SiCOH film. Although it is assumption, the monoglyme is adsorbed onto the surface of the SiCOH film, and this will be proved by the following test examples including the result of XPS (X-ray Photoelectron Spectroscopy).

Figure 12B:
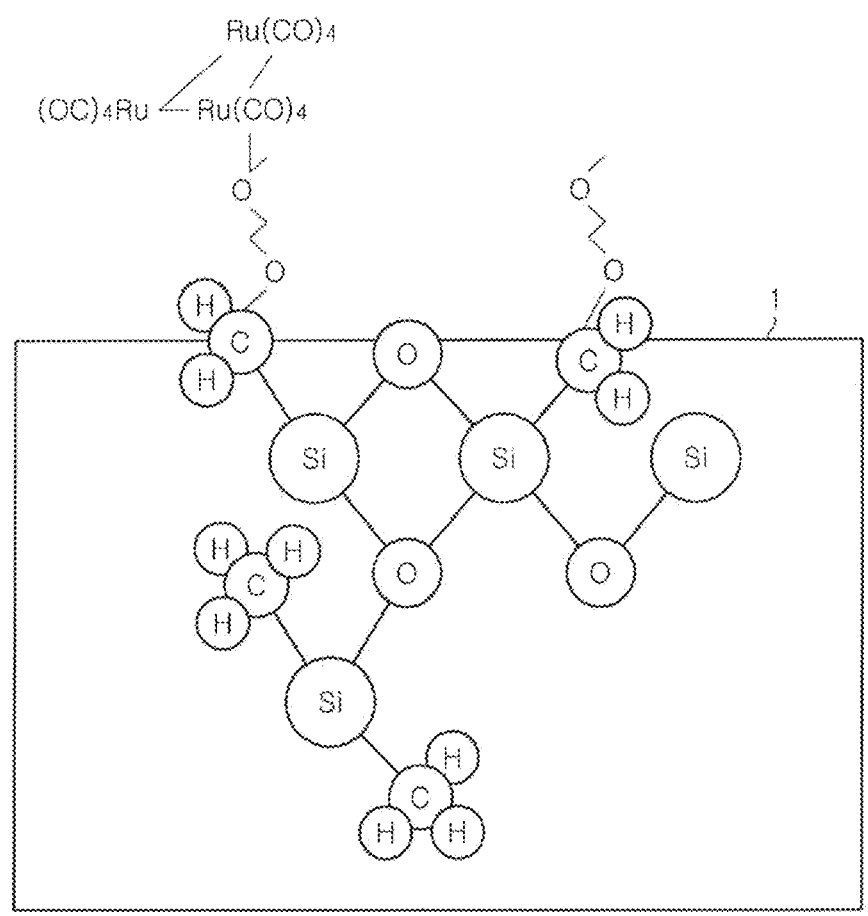

When monoglyme from which methyl group is eliminated is adsorbed onto the surface of the substrate in a vertical direction, adsorbates become adsorption portions (adsorption sites) of Ru. Thus, nucleation and growth of Ru becomes easier. In other words, the raw material gas is easily adsorbed as shown in FIG. 12B. As a result, the nucleation speed of Ru in the initial stage of the film formation is improved, and a continuous film can be formed. Thus, the same result as that of the first embodiment is obtained.

Figure 11B:
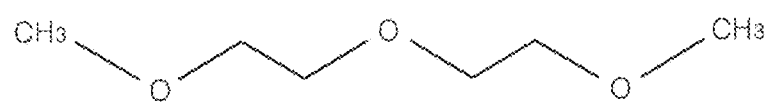

The glyme is not limited to monoglyme, and may also be diglyme shown in FIG. 11B or the like. In that case, the same effect can be obtained.

Further, glyme, e.g., monoglyme, may be supplied to the substrate in a gaseous state instead of a liquid state. As for a module for performing treatment using a gas, it is possible to use, e.g., a module in which the processing gas supply system in the Ru film formation module shown in FIG. 6 is substituted by a monoglyme gas supply system. As for a method for supplying a monoglyme gas into the processing chamber, it is possible to employ a method for supplying a liquid chemical, e.g., monoglyme, sublimated by a carrier gas such as He gas or the like while setting the processing atmosphere to a vacuum atmosphere.

Figure 13:
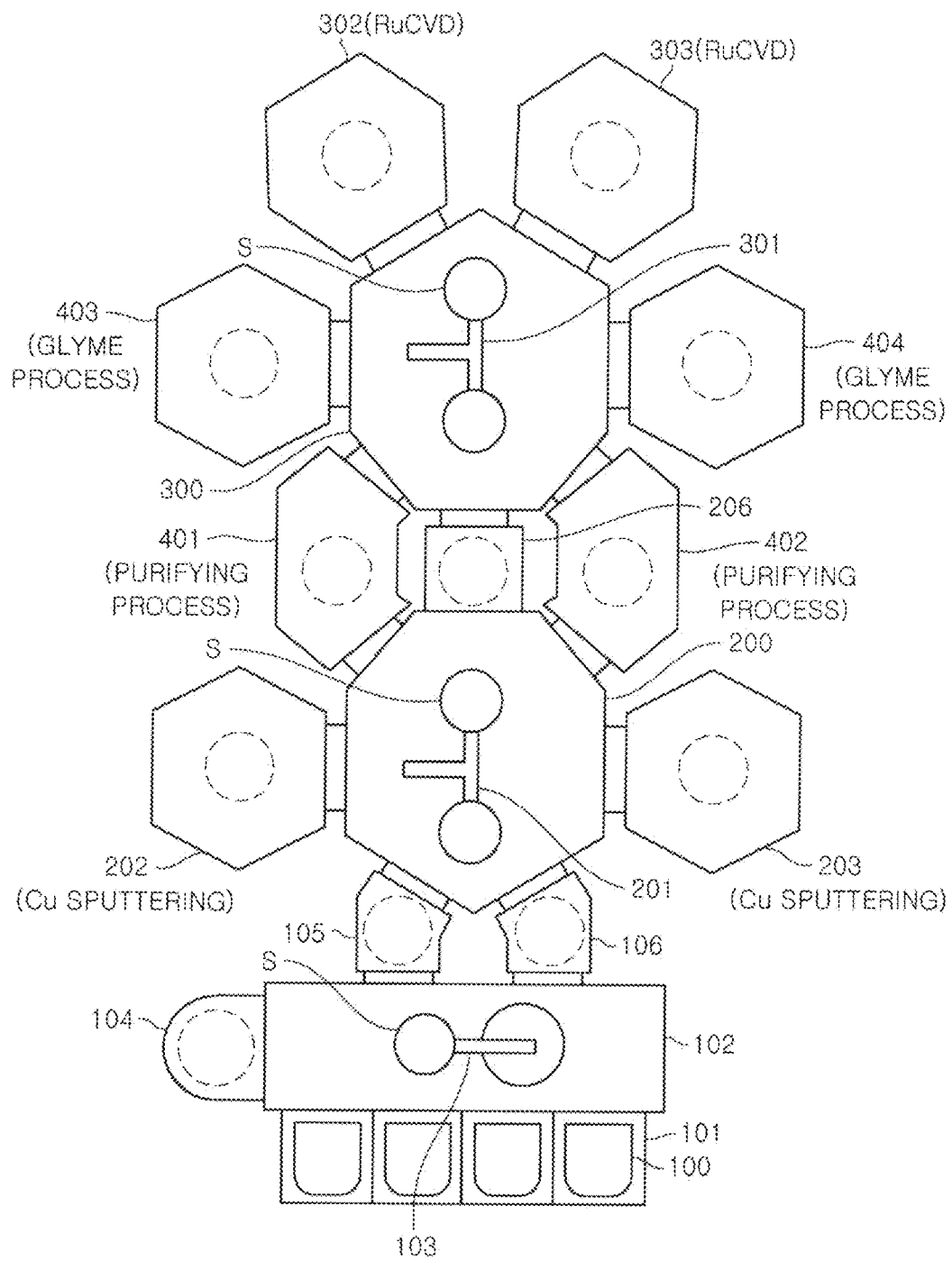
FIG. 13 is a schematic plan view showing a substrate processing apparatus as a multi chamber system for performing a series of processes performed in the fourth embodiment.

FIG. 13 shows an example of a substrate processing system for performing a series of processes on the substrate in which the recess 2 is formed on the interlayer dielectric film 1 in the case of performing surface treatment by supplying glyme to the substrate in a gaseous state. The substrate processing system shown in FIG. 13 is different from the substrate processing system shown in FIG. 7 in that modules 401 and 402 for performing a purifying process are provided instead of the modules 204 and 205 for performing a modification process using H radicals and also in that processing modules 403 and 404 for performing surface treatment using a glyme gas are connected to the second vacuum transfer chamber 300.

In this substrate processing system, first, the substrate S loaded from the transfer container 100 is subjected to a purifying process in the module 401 (or 402). The module 401 (or 402) removes H ions in the plasma by using a conductive mesh body provided between the substrate S and the plasma generation space in the apparatus shown in FIG. 3 and then supplies H radicals that have passed through the mesh body to the substrate S. The purified surface of the substrate S is processed with a glyme gas by the surface (modification) processing module 403 or 404. Thereafter, the substrate S is loaded into the CVD module 302 (or 303), and the Ru film 4 is formed. Next, the substrate S is processed as described in FIG. 7.

[Fifth Embodiment]

Figure 14:
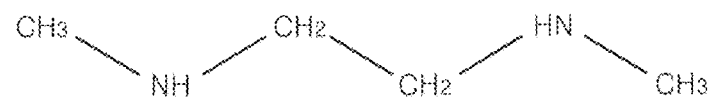
FIG. 14 explains a molecular structural formula of a chemical used in a fifth embodiment.

The present embodiment is the same as the fourth embodiment except that DMEDA (N,N'-dimethylethylenediamine) is used as a chemical for modifying the surface of the interlayer dielectric film 1 instead of glyme used in the fourth embodiment. The molecular structure of DMEDA is shown in FIG. 14. DMEDA is supplied in a liquid state or a gaseous state to the surface of the substrate having a surface structure shown in FIG. 10A and, then, the surface treatment (modification process) is carried out. When DMEDA is supplied to the SiCOH film, hydrogen of the SiCOH film is substituted by methyl groups of the DMEDA as in the case of monoglyme. If DMEDA has polarity, the DMEDA may be adsorbed to oxygen of the SiCOH film.

Figure 15A:
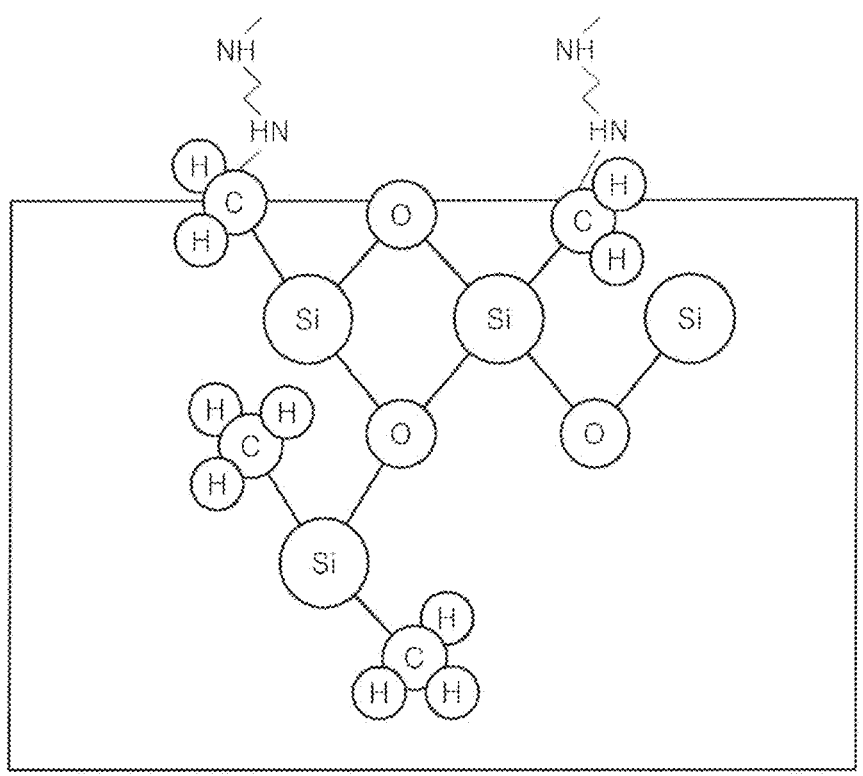
FIGS. 15A and 15B schematically explain a molecular structure on a surface of a dielectric film after a modification process performed in the fifth embodiment.
Figure 15B:
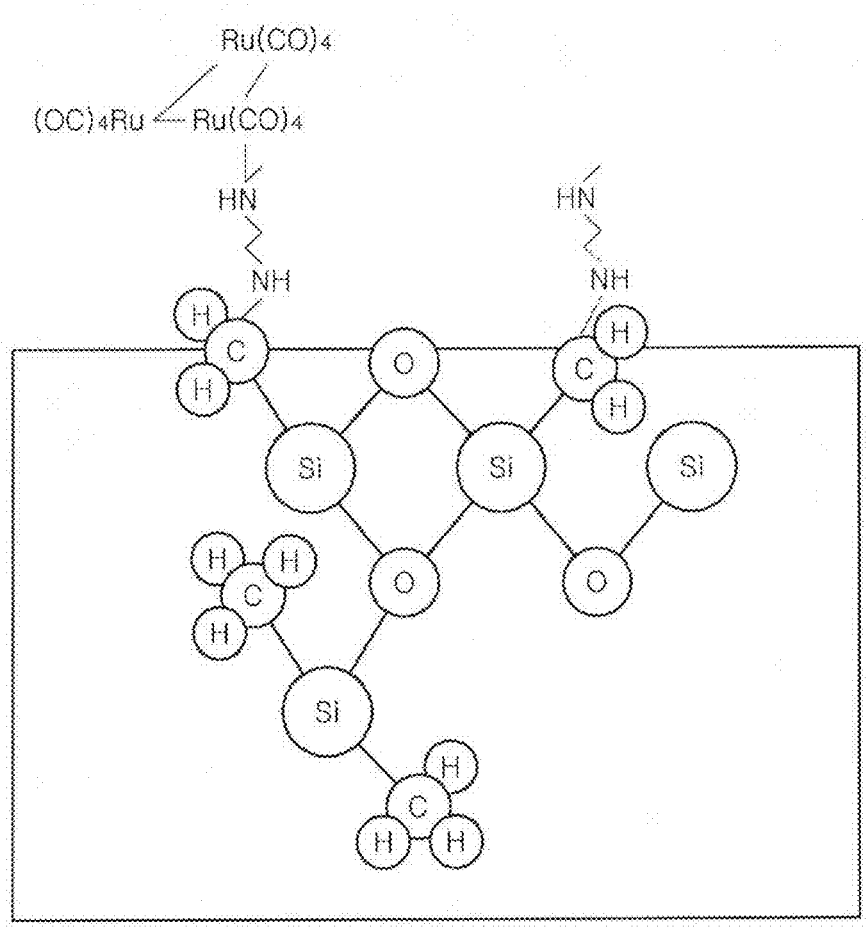
Figure 16A:
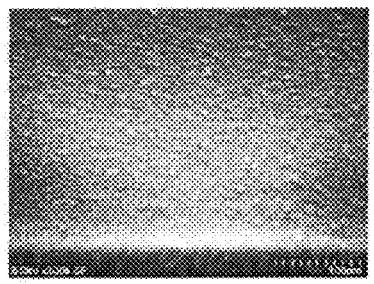
FIGS. 16A to 16F are SEM images showing a Ru film formation state which are captured to examine the effect of the first embodiment.
Figure 16B:
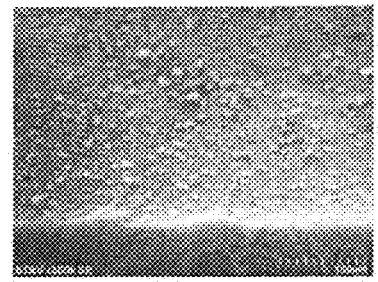
Figure 16C:
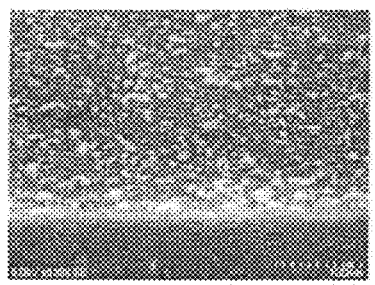
Figure 16D:
Figure 16E:
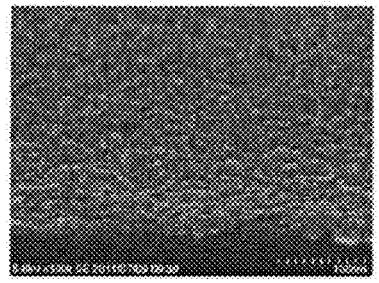
Figure 16F:
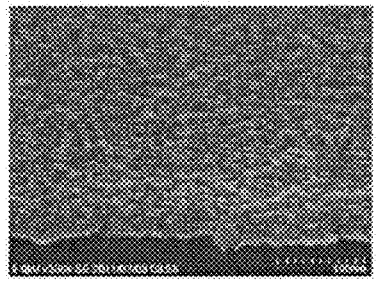
Figure 17A:
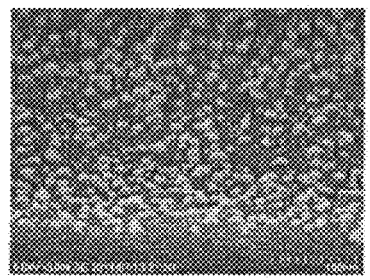
FIGS. 17A to 17F are SEM images showing a Ru film formation state which are captured to examine the effect of the first embodiment.
Figure 17B:
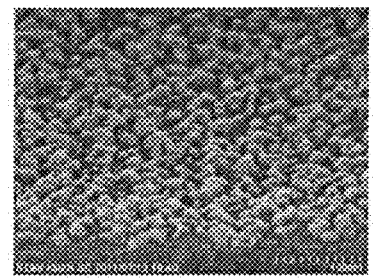
Figure 17C:
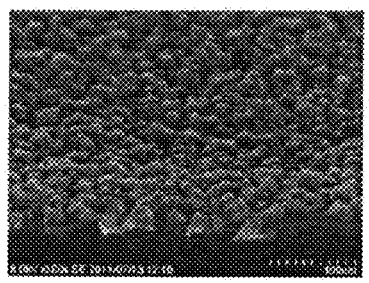
Figure 17D:
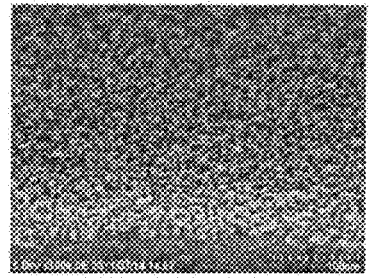
Figure 17E:
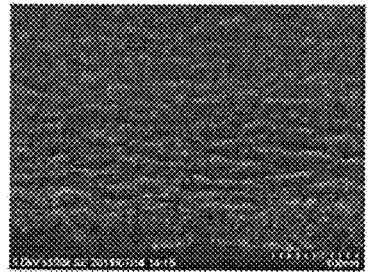
Figure 17F:
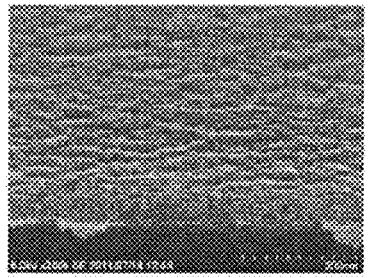

Hence, it is estimated that main components of DMEDA are chemically adsorbed as shown in FIG. 15A. This estimation is based on the result of XPS to be described later. Therefore, as in the fourth embodiment, nucleation and growth of Ru easily occurs (see FIG. 15B), and the same effect as that of the first embodiment is obtained.

In accordance with the second to fifth embodiments of the present invention, the surface of the recess is modified by supplying hydrogen peroxide, glyme or DMEDA to a dielectric film, e.g., a SiCOH film having a burying recess formed therein. Therefore, the surface of the recess can have a hydrophilic property, and a Ru film can be directly formed on the surface of the recess without using a base film.

TEST EXAMPLE 1

An unprocessed surface of a SiCOH film formed on a substrate was set to a specimen 1. A surface of a SiCOH film, which is obtained after only H radicals are supplied while removing H ions by a metal mesh body provided at an outlet of the plasma generation line 75 of the processing module shown in FIG. 3, was set to a specimen 2. A surface of a film which was subjected to, as in the first embodiment, a modification process using H radicals and H ions by the processing module shown in FIG. 3 was set to a specimen 3.

As a result of comparing a composition ratio of Si and C on the surfaces of the SiCOH films of the specimens 1 to 3 by a XPS, the composition ratio of Si and C was about 0.74 in the specimen 1, about 0.70 in the specimen 2, and about 0.31 in the specimen 3. Thus, it is clear that $CH_3$ is removed from the surface of the SiCOH film by the modification process of the present invention.

In this example, the peak intensity of the SiCOH film subjected to the modification process in accordance with the first embodiment is smaller than or equal to a half of the peak intensity of the SiCOH film that has not been subjected to the surface treatment. In order to obtain the effect in which the Ru film is continuously formed, the peak intensity of the modified SiCOH film may be about 50% or less of the peak intensity of the unmodified SiCOH film.

TEST EXAMPLE 2

A SiCOH film was formed on a substrate and, then, a Ru film was formed on the surface of the SiCOH film by the method described in the first embodiment without performing a modification process for modifying the film from a hydrophobic state to a hydrophilic state. This process was set to a comparative example 2.

Meanwhile, the SiCOH film was modified by H radicals and H ions as described above in the first embodiment and, then, the Ru film was formed on the surface of the SiCOH film. This process was set to a test example 2.

Next, the surface of the substrate in SEM images was monitored when about 100 seconds, 200 seconds and 300 seconds elapsed after the formation of the Ru film. The result thereof is shown in FIGS. 16A to 16F. In the test example 2 (i.e., FIGS. 16D to 16F), notations such as 1.5 nm and the like indicate a film thickness of the Ru film. As can be seen from this result, when the modification process is not performed on the SiCOH film, the nucleation and growth of Ru does not proceed because the surface thereof is hydrophobic. However, when the modification process is performed, the nucleation and growth of Ru proceeds and the continuous film formation is carried out.

TEST EXAMPLE 3

A SiCOH film was formed on a substrate and, then, this film was etched by RIE (Reactive Ion Etching). Next, a Ru film was formed on the surface of the SiCOH film by the method described in the first embodiment. This process was set to a comparative example 3.

Meanwhile, the SiCOH film etched by RIE was modified by hydrogen peroxide supplied thereto as described in the second embodiment. Then, a Ru film was formed on the surface of the SiCOH film. This process was set to a test example 3.

Next, the surface of the substrate in SEM images was monitored when about 100 seconds, 200 seconds and 300 seconds elapsed after the formation of the Ru film. The result thereof is shown in FIGS. 17A to 17F. As can be seen from this result, in the comparative example 3, a continuous film is not obtained even after about 300 seconds elapsed. However, in the test example 3, a continuous film is obtained after about 200 seconds elapses. Thus, the surface of the SiCOH film can be modified from a hydrophobic state to a hydrophilic state by supplying hydrogen peroxide.

TEST EXAMPLE 4

A SiCOH film was formed on a substrate, and water drops were dropped on the film. At this time, images of the water drops were captured by a camera. This was set to a comparative example 4.

As described in the first embodiment, the surface of the substrate was modified by supplying a plasma containing H radicals and H ions to the substrate and, then, water drops were dropped on the modified film. The images of the water drops were captured by a camera. This was set to a test example 4.

Figure 18A:
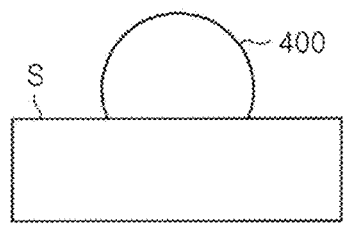
FIGS. 18A and 18B explains a result of monitoring a drop of water fallen on the surface of the substrate to examine the effect of the first embodiment.
Figure 18B:
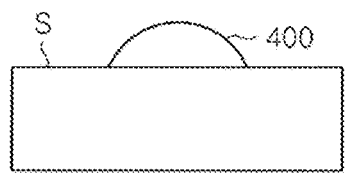

FIGS. 18A and 18B show schematic diagrams obtained based on the captured results of the respective example. A reference numeral '400' indicates a water drop. This result shows that the first embodiment can modify the surface of the SiCOH film from a hydrophobic state to a hydrophilic state.

TEST EXAMPLE 5

In order to examine the effect of the third embodiment (the method for modifying the surface of the SiCOH film by using hydrogen peroxide), a substrate of the comparative example 5 and that of the test example 5 were prepared. In the comparative example 5, the SiCOH film of the substrate was etched by a plasma of a CF-based gas that is generally used to form the recess 2. In the test example 5, the surface of the substrate was processed by supplying hydrogen peroxide thereto.

Figure 19:
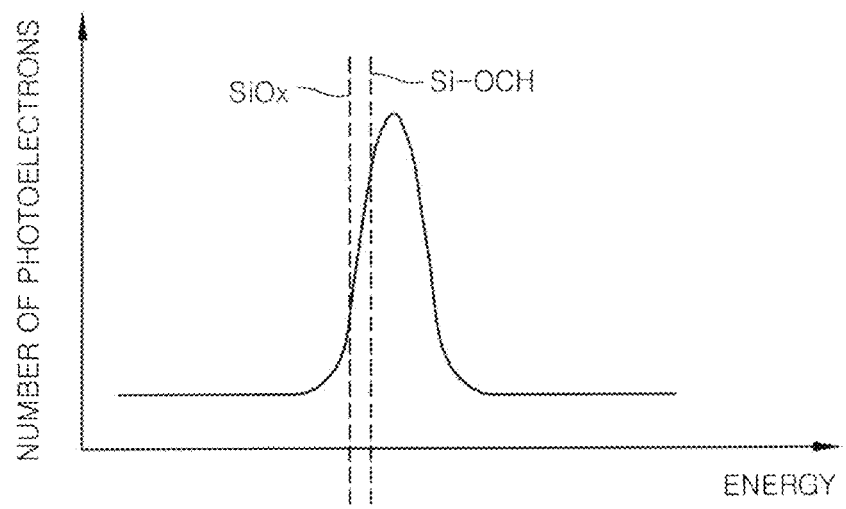
FIG. 19 presents characteristic views showing XPS spectra for examining the effect of the third embodiment.
Figure 19:
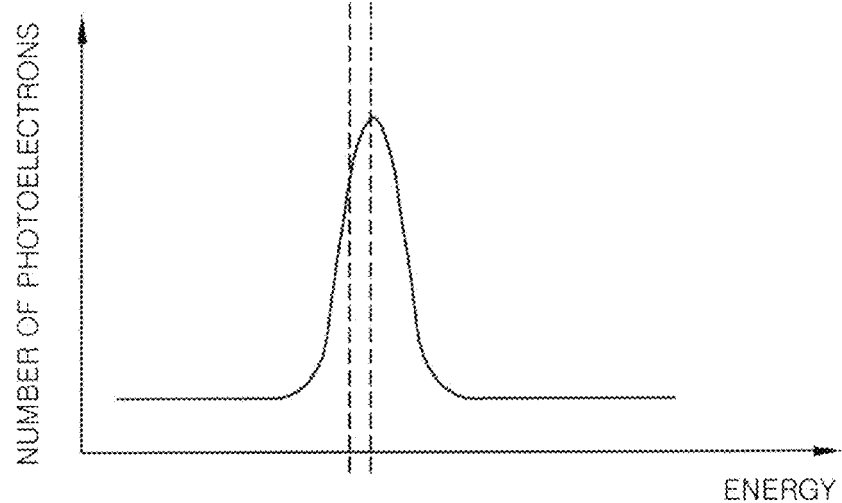
Figure 20:
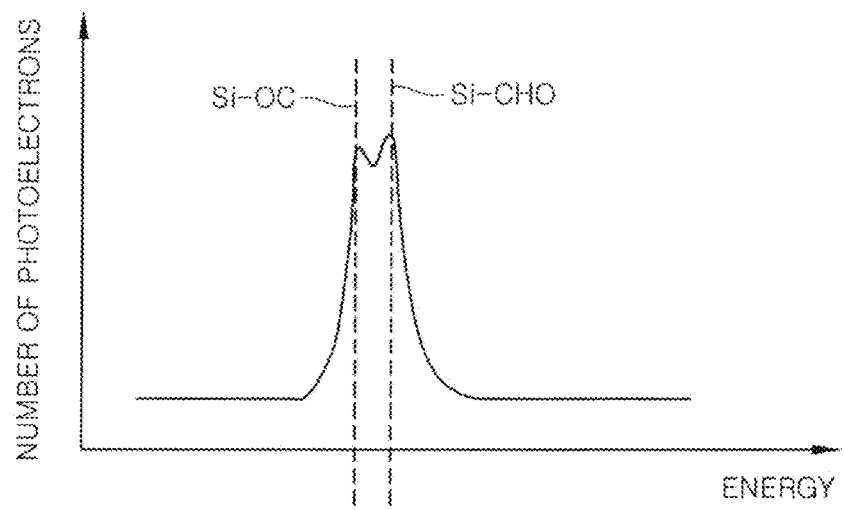
FIG. 20 shows characteristic views showing XPS spectra for examining the effect of the third embodiment.
Figure 20:
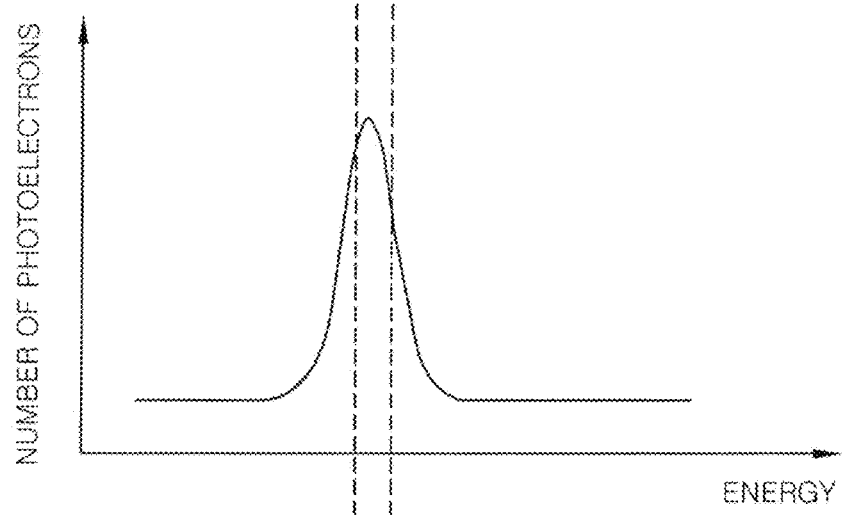

FIGS. 19 and 20 show a result of performing XPS on the surfaces of the substrates. In each drawing, the horizontal axis indicates an energy of photoelectrons when X-ray is irradiated, and the vertical axis indicates the number of monitored photoelectrons. FIGS. 19 and 20 show spectra near energies corresponding to an O1s orbit and a Si2P orbit, respectively. The spectra show that the Si—O bonds become increased by processing the surface with hydrogen peroxide. This is because the methyl groups bonded to silicon of the SiCOH film shown in FIG. 4 are substituted by oxygen of hydrogen peroxide. Therefore, it was proved that the surface of the SiCOH film was modified to a hydrophilic state by using hydrogen peroxide.

TEST EXAMPLE 6

In order to examine the effect of the fourth embodiment (the method for modifying the surface of the SiCOH film by glyme), a substrate of the comparative example 6 and that of the test example 6 were prepared. In the comparative example 6, the SiCOH film of the substrate was etched by a plasma of a CF-based gas that is generally used to form the recess 2. In the test example 6, the surface of the substrate was processed by submerging the substrate into the monoglyme solution.

Figure 21:
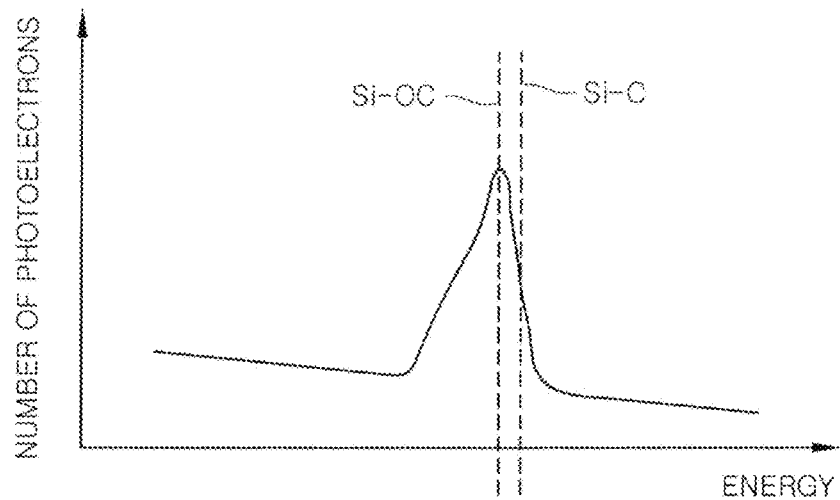
FIG. 21 depicts characteristic views showing XPS spectra for examining the effect of the fourth embodiment.
Figure 21:
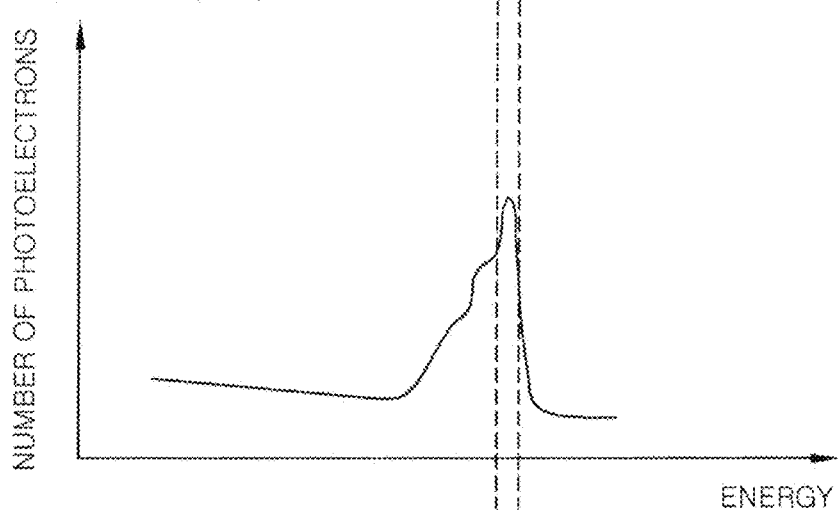

FIG. 21 show a result of performing XPS on the surfaces of the substrates. FIG. 21 shows spectra near the energy corresponding to a Cis orbit. The spectra show that the Si—C bonds become increased by processing the surface with the monoglyme solution. As will be described later, when the surface is processed with the monoglyme solution, the Ru film is formed with good quality. Thus, the Si—C bonds are considered to be Si—C=O bonds.

TEST EXAMPLE 7

Figure 22:
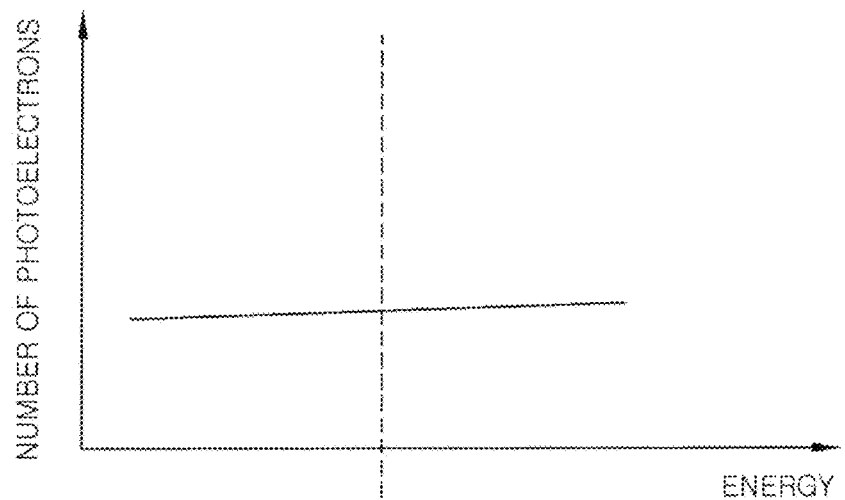
FIG. 22 presents characteristic views showing XPS spectra for examining the effect of the fifth embodiment.
Figure 22:
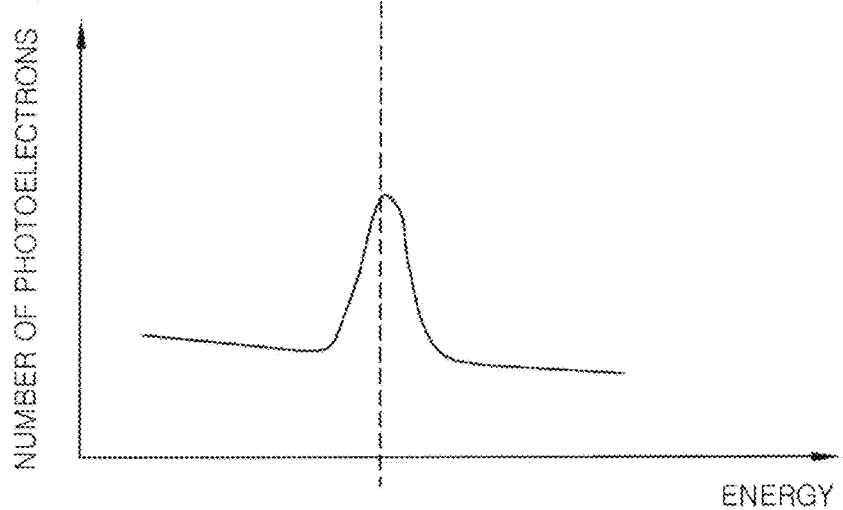

In order to examine the effect of the fifth embodiment (the method for modifying the surface of the SiCOH film by DMEDA), a substrate of the comparative example 7 and a substrate of the test example 7 were prepared. In the comparative example 7, the substrate same as that of the comparative example 6 was used. In the test example 7, the surface of the substrate same as that of the comparative example 7 was processed by submerging the substrate in the DMEDA solution. FIG. 22 shows the result of performing XPS on the surfaces of the substrates. FIG. 22 show spectra near the energy corresponding to an N1s orbit. The spectra show that N—H bonds are generated by processing the surface with the DMEDA solution. Therefore, it was proved that the DMEDA (specifically, main components of the DMEDA) were adsorbed onto the surface of the SiCOH film.

TEST EXAMPLES 8 and 9

In order to examine the effects of the fourth and the fifth embodiment, the following test was performed. A Ru film was formed on the surface of the substrate same as that of the comparative example 6 by the method described in the first embodiment. This process is set to a comparative example 8. Further, a Ru film was formed on the surface of the substrate same as that of the comparative example 6 after processing the surface with monoglyme solution supplied by a spin coating method. This process is set to a test example 8. Then, the surface was modified with the DMEDA solution instead of the monoglyme solution. This process is set to a test example 9.

Figure 23:
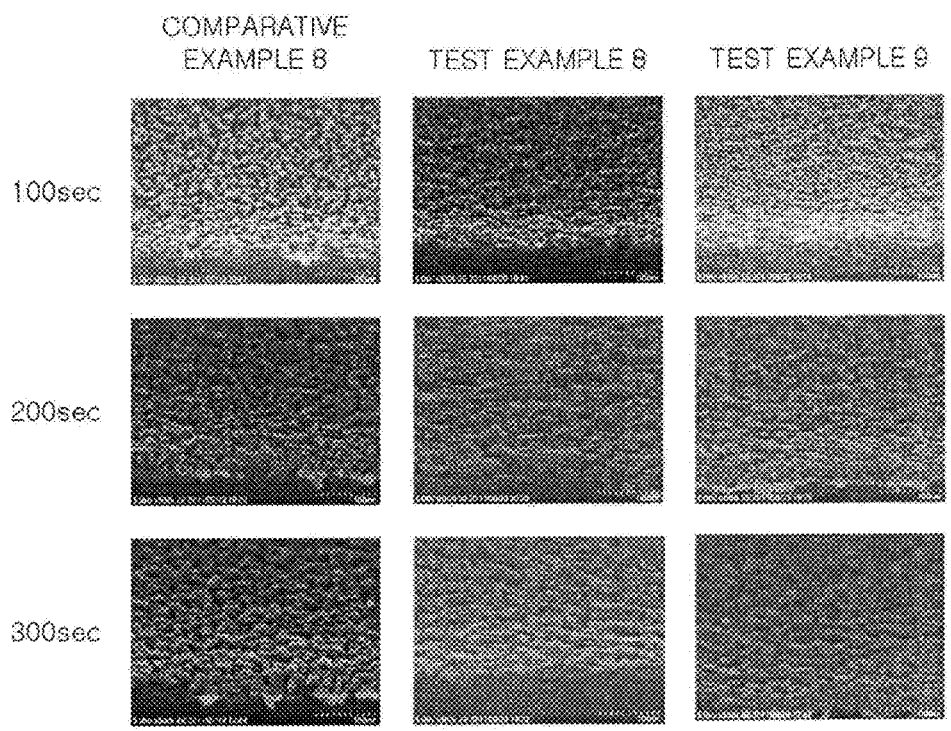
FIG. 23 shows SEM images showing a Ru film formation state which are captured to examine the effects of the fourth and the fifth embodiment.
Figure 24:
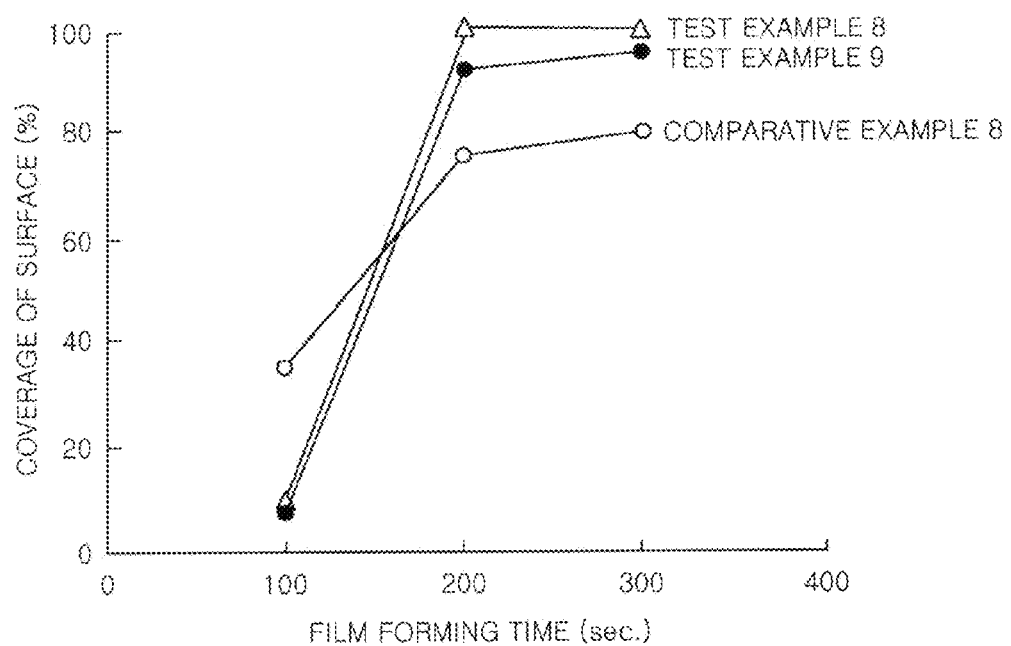
FIG. 24 is a characteristic view showing a result of a coverage of Ru which is obtained based on the images shown in FIG. 23.
Figure 25A:
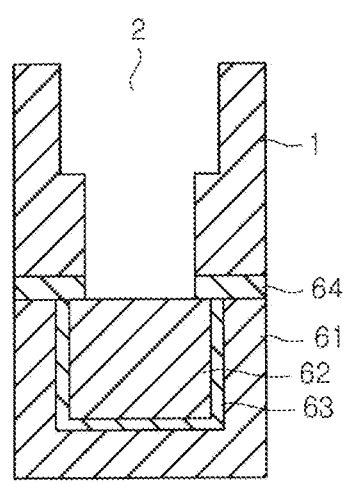
FIGS. 25A to 25E explain a series of conventional copper wiring forming processes in a stepwise manner.
Figure 25B:
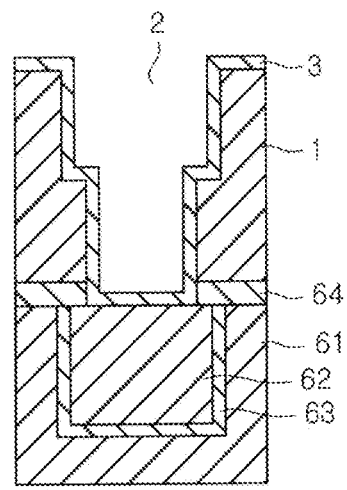
Figure 25C:
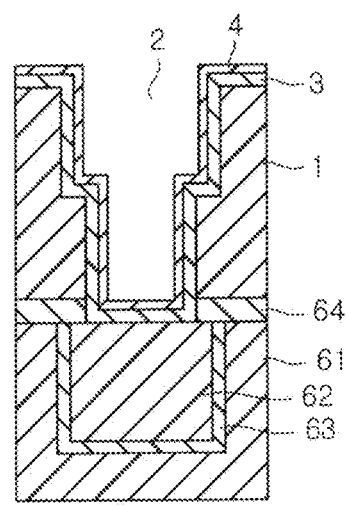
Figure 25D:
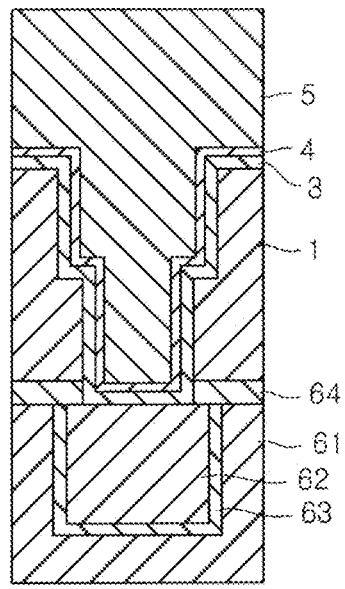
Figure 25E:
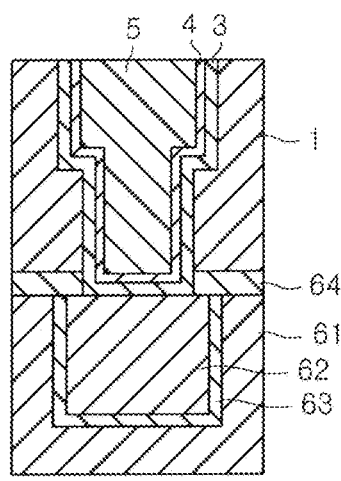

The SEM images of the surfaces of the substrates were captured when about 100 seconds, 200 seconds and 300 seconds elapsed after the Ru film formation. FIG. 23 shows the result thereof. Moreover, the coverage of the surface of the substrate by the Ru film at each timing was obtained from the images. The result thereof is shown in FIG. 24. As can be seen from these results, when the SiCOH film is not subjected to the surface (modification) treatment, the surface has a hydrophobic property. Therefore, the nucleation and growth of Ru does not proceed, and continuous processing is not carried out. However, when the surface is processed with monoglyme solution or DMEDA solution, the nucleation and growth of Ru proceeds and continuous processing is carried out.

While the invention has been shown and described with respect to the embodiments, it will be understood by those skilled in the art that various changes and modification may be made without departing from the scope of the invention as defined in the following claims.

What is claimed is:

1. A semiconductor device manufacturing method comprising:
    modifying a surface of a burying recess formed in a dielectric film by supplying dimethylethylenediamine in a liquid or a gaseous state to the dielectric film formed on a substrate and containing silicon, carbon, hydrogen and oxygen, a bottom portion of the burying recess being exposed with a lower conductive layer, wherein the dimethylethylenediamine is adsorbed onto the surface of the dielectric film to thereby enhance a nucleation and a growth of Ru;
    directly forming a barrier film formed of a Ru film on the modified surface of the recess, wherein the Ru film is formed by using chemical vapor deposition Ru3(CO)12 gas and CO gas; and
    burying copper forming a conductive path in the recess.

2. The semiconductor device manufacturing method of claim 1, wherein the Ru film essentially consists of Ru.

3. The semiconductor device manufacturing method of claim 1, wherein the Ru film is made of pure Ru.

* * * * *